(12) United States Patent
Saito et al.

(10) Patent No.: US 6,495,769 B1
(45) Date of Patent: Dec. 17, 2002

(54) WIRING BOARD AND PRODUCTION METHOD THEREOF, AND SEMICONDUCTOR APPARATUS

(75) Inventors: Toshiro Saito, Hitachi (JP); Haruo Akahoshi, Hitachi (JP); Takeyuki Itabashi, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/536,645

(22) Filed: Mar. 28, 2000

(30) Foreign Application Priority Data

Mar. 31, 1999 (JP) ............................................ 11-092415

(51) Int. Cl.⁷ ................................................ H05K 1/03
(52) U.S. Cl. ........................ 174/255; 174/250; 174/260
(58) Field of Search ................................ 174/250, 255, 174/256, 257, 258, 259, 260

(56) References Cited

U.S. PATENT DOCUMENTS

| | | | | |
|---|---|---|---|---|
| 3,841,903 A | * | 10/1974 | Huang et al. | 117/138.8 F |
| 5,157,107 A | * | 10/1992 | Nikaido et al. | 528/353 |
| 5,260,913 A | * | 11/1993 | Kadota et al. | 367/140 |

* cited by examiner

*Primary Examiner*—Kamand Cuneo
*Assistant Examiner*—Jeremy Norris
(74) *Attorney, Agent, or Firm*—Antonelli, Terry, Stout & Kraus, LLP

(57) ABSTRACT

Provided is a wiring board and production method thereof, wherein production of wiring by a full additive method is achieved. This is extremely useful in forming fine copper wiring featuring a high adhesion on an insulating resin substrate. A resin having an excellent alkali resistance is used as the insulating resin substrate, and the copper wiring is formed on the insulating resin substrate through a degenerated layer containing amide group and a metallic oxide layer of a metal having a reduction potential more base than that of copper. The degenerated layer can be provided by, e.g., introduction of amide group into the surface of the insulating resin substrate. The copper can be formed by processes including electroless plating. The insulating resin substrate has superb heat resistance and dimensional stability, and the formed structure can provide a highly packed wiring board.

20 Claims, 8 Drawing Sheets

- 14 METALLIC LAYER
- 13 METALLIC OXIDE LAYER
- 12 AMIDE GROUP-CONTAINED LAYER
- 11 RESIN SUBSTRATE

□ AFTER VACUUM DRYING LEFT TO STAND IN OXYGEN ATMOSPHERE
○ AFTER VACUUM DRYING LEFT TO STAND IN ATMOSPHERE
△ NOT DRIED REFT TO STAND IN ATMOSPHERE (a)

(b)

WIRING BOARD AND PRODUCTION METHOD THEREOF, AND SEMICONDUCTOR APPARATUS

BACKGROUND OF THE INVENTION

The present invention relates to a wiring board and production method thereof, and semiconductor apparatus made up thereof.

Increasing speed and density in LSI technology in recent years have come to require a finer size of electronic circuit wires, a multi-layered structure and further improvement of electric characteristics. To meet these requirements, studies have been made to manufacture multi-layered wiring boards made up of organic insulating materials featuring excellent flatness, heat resistance, dimensional stability and dielectric characteristics.

When copper-made wiring is formed on the organic insulating resin substrate, the biggest problem is how to get a close adhesion between the copper wiring and resin substrate. Conventionally, it was the common practice to improve adhesion with the metallic film deposited on the resin substrate surface through anchoring effect or mechanical entanglement by roughening the resin substrate surface by soft-etching it or by placing rubber component into resin substrate in advance and dissolving it with solvent. This method, however, requires tens of microns of an uneven spot to ensure sufficient adhesion. It has been difficult to create fine wiring having a line width not exceeding tens of microns. It has been required to develop a method of accelerating adhesion which ensures a high adhesion merely by creating an uneven spot sufficiently smaller than wiring/space interval on the surface, wherein adhesion does not degenerate even at a high temperature.

Subtract and additive methods are known as methods for forming copper wiring on the organic insulating resin substrate. The subtract method produces wiring circuits by metalizing copper over the entire substrate, thereafter removing by etching the copper of the portion which is unnecessary as wiring. To metalize copper over the entire substrate, CVD and spatter methods are generally used. According to another proposed method, a thin layer of copper is plated onto the entire substrate by thin electroless copper plating, and electric copper plating is used to deposit a thick layer of copper thereafter. For example, the Patent Official Gazette of Japanese Patent Laid-Open NO.187778/1992 discloses a method of depositing copper onto the entire polyimide to a thickness of about 0.3 $\mu$m by electroless plating, following by application to a thickness of about 35 $\mu$m by electroplating. The subtract method requires the copper plate having a thickness not less than 10 $\mu$m to be etched onto the resin substrate, with the result that the side of the copper wiring line must be etched, and the side close to the substrate of the wiring line becomes thin. This makes it difficult to produce a fine line/space pattern. It has been possible to create a line/space pattern of about 40 $\mu$m at most.

The additive method, on the other hand, is a method of producing a circuit pattern on the substrate by resist and depositing conductive metals along said pattern. This method is suited for production of fine wiring because the aspect ratio of copper wiring line is equivalent to the resolution of the resist. This additive method can be further divided into semi-additive and full-additive methods.

According to the semi-additive method, a thin layer of metal is deposited on the entire substrate, then plated resist is created. After that, a thick layer of conductive metal or copper in many cases is plated by electro plating or electroless plating. Subsequent to separation of the resist, the ground metallic film is etched out, thereby producing wiring. It is the common practice to apply a very thin layer of copper by electroless plating onto the copper-plated laminate with copper etched out, and to apply a thick layer of copper by electroplating or electroless plating subsequent to resist formation. After separation of resist, the thin copper film is etched out. This method is suited for the substrate with its surface having tens of microns of an uneven spot, such as the copper-plated laminate with copper etched out, but cannot be used for a more smooth substrate since effective adhesion cannot be ensured. To get higher adhesion, a method is proposed wherein metal other than copper is plated on the substrate; then a thick layer of copper is plated thereto. For example, the Official Gazette of Japanese Patent Laid-Open NO.65061/1998 discloses a method wherein a ground metallic layer is formed on the insulating film by vapor deposition or sputtering dry plating method, and electroless plating followed by electroplating is provided thereon. This method is alleged to permit wiring boards to be produced in a semi-additive method. The ground metallic layer is formed on the insulating substrate, and resist is formed thereon. Then a thick layer of copper is plated by electroplating, and the ground metallic layer is etched out after separation of resist, with the result that fine wiring having dimensions as close to those of the resist is formed. When ground metal and copper coexist, however, it is very difficult to etch only the ground metal. Furthermore, when ground metal is etched out, the copper wiring and ground metal portion thereunder have different width. A slight clearance may be produced between the insulating substrate and ground metal layer. This will raise a problem that, when the wiring board is laminated with insulating adhesive resin, this clearance is not sufficiently filled with adhesive resin, and remains as void.

According to the full additive method, the substrate is provided with plating catalyst; then plated resist is provided. Conductive metal, for example, copper electroless plated, and the resist is separated or is left as permanent resist, as required, thereby producing the wiring board. Since there is no process of etching out the thin ground metallic film, the number of processes is reduced. Since the form of wiring is determined by the form of resist, this method is advantageous to the formation of fine wiring, so the full-additive method is more preferred. Furthermore, even when ground metal other than copper is used, there is no etching process. Since the form of the conductor is determined by the form of resist, there is no problem of a clearance being produced between the insulating substrate and ground metallic layer, as observed in the semi-additive method. However, one of the big problems with the full additive method is that it is difficult to provide electroless plating to the resin substrate with excellent adhesion. A method is proposed to roughen the resin substrate in order to realize tight adhesion. In creating a fine line pattern not exceeding 40 $\mu$m, it has been difficult to use the substrate having an uneven spot not less than microns. For this reason, it has been required to develop a method for providing electroless copper plating on the resin substrate having an uneven spot which is sufficiently smaller than width of the line/space pattern, said plating ensuring a high adhesion free from separation even during electroless plating. The Official Gazette of Japanese Patent Laid-Open NO. 72070/1992 discloses that a high adhesion can be obtained by etching the polyimide resin substrate and providing catalyst, followed by electroless plating and heat treatment at 120° C. or more. However, this Official Gazette failed to provide a thick layer of one micron or more by electroless plating.

The object of the present invention is to provide a wiring board having a fine wiring layer featuring high adhesion, production method thereof, and semiconductor apparatus.

SUMMARY OF THE INVENTION

The present invention relates to a wiring board characterized in that a wiring layer comprising a plated film having a line width of 10 to 40 $\mu$m, preferably 15 to 35 $\mu$m, and a thickness of 15 to 45 $\mu$m, preferably 15 to 35 $\mu$m is formed on an insulating resin substrate through the degenerated layer formed on the surface of said insulating resin substrate, and the average roughness at the centerline of said substrate of at least the portion where said wiring layer is formed is equal to or smaller than 1.0 $\mu$m, preferably in the range from 0.05 to 0.3 $\mu$m.

The present invention is characterized in that a wiring layer is located on the insulating resin substrate, and said wiring layer is formed through the degenerated layer including the amide group formed on said resin substrate surface, and various layers including a metallic oxide layer.

The present invention relates to a wiring board characterized in that said board has wiring on an insulating resin substrate, and said wiring layer is formed through the degraded layer wherein the average roughness at the centerline of said substrate surface formed on the surface of said resin substrate is 0.1 to 1.0 $\mu$m, preferably in the range from 0.3 to 0.7 $\mu$m, and various layers including a metallic oxide layer formed on the surface of said wiring.

Said wiring layer is preferred to be formed by sequential lamination of a catalyst layer, electroless plated film and electroplated film on the surface of said metallic oxide layer.

The present invention is intended for formation of fine wiring having a line width equal to or smaller than 40 $\mu$m with excellent adhesion, and, for this purpose, ensures that the average roughness at the centerline on the surface of the insulating resin substrate is kept equal to or smaller than 1.0 $\mu$m. So far, such surface roughness has failed to ensure a high adhesion; however, formation of such fine wiring is provided by the processing adopted in the present invention. Furthermore, the size equal to or smaller than 40 $\mu$m can be obtained in the line/space pattern. This size is preferred to be 10 $\mu$m, and is more preferred to be in the range from 20 to 35 $\mu$m. Such fine wiring can be obtained by using a peeling strength of 300 N/m or more. In particular, the value obtained by a peeling strength (N/m) multiplied by line width ($\mu$m) should be equal to or greater than 10,000, preferably equal to or greater than 15,000, and more preferably equal to or greater than 20,000. Peeling strength is preferred to be higher as the line width is smaller. For the wiring layer, the value obtained by multiplying the line width by thickness thereof is preferred to be in the range from 400 to 1200 $\mu$m$^2$, and is more preferred to be in the range from 500 to 800 $\mu$m$^2$.

The present invention generates amide group by modifying the surface of the resin substrate featuring excellent heat resistance and dimensional stability, and the metal having a reduction potential more base than that of copper is deposited thereon. The oxide layer of said metal is formed at the interface of the two, then copper is deposited on said metal to raise adhesion between the resin substrate and copper and to minimize degeneration of adhesion at a high temperature, thereby getting an extremely reliable wiring board. Copper wiring is formed on the resin substrate according to the full-additive method which is very effective for the formation of fine steel wire having a line width of tens of microns on said resin substrate.

The inventors of the present invention have studied to find out the chemical interaction which improves adhesion between the resin substrate and metal to be deposited, and has succeeded in locating a very powerful interaction is applied between the amide group and metallic oxide film.

The present invention is preferred to be composed of (1) an insulating resin substrate, (2) a metallic film deposited on said insulating resin substrate, (3) a layer including the amide group formed on the surface on the side of said resin substrate at the interface between said metal and said resin substrate, and (4) metallic oxide film formed on the surface on said metallic film side at said interface; and wiring with said metallic film as a conductor is preferably provided on said resin substrate.

The wiring board where wiring with copper as a conductor is provided on the insulating resin substrate according to the present invention is preferred to be formed by sequential lamination of (1) a degenerated layer formed on said insulating resin substrate by plasma treatment of said insulating resin substrate, (2) a metallic oxide layer of the metal having a reduction potential more base than that of copper, (3) a metallic layer of said metal, and (4) a copper layer.

The metal having a reduction potential more base than that of copper according to the present invention is preferred to contain at least one of nickel, tin and cobalt.

In the production of a wiring board wherein wiring with copper as a conductor provided on the insulating resin substrate according to the present invention, the present invention comprises (1) a step of providing plasma treatment on the surface of the resin substrate comprising the resin where the velocity of dissolving the mixture solution of hydrazine and ethylenediamine mixed at the ratio of 7 to 3 does not exceed 1 $\mu$m/min. at a solution temperature of 30° C., (2) a step of providing the metallic layer of the metal having a reduction potential more base than that of copper on the plasma-treated surface of said resin substrate by electroless plating, (3) a step of forming an oxide layer of said metal at the interface between said metallic layer and said resin substrate in contact therewith, and (4) a step of forming a copper layer on said metallic layer by electroless plating.

In the present invention, plasma treatment is preferred to be provided on the insulating resin substrate in such a way that average roughness at the centerline on the treated surface will be within the range from 0.1 (inclusive) to 1.0 $\mu$m (inclusive).

In the present invention, a step of providing plating catalyst on the plasma-treated surface of said resin substrate and a step of forming a plated resist are preferred to be provided between the step of providing plasma treatment on the resin substrate and the step of providing a metallic layer on the plasma-treated surface of said resin substrate.

The wiring board according to the present invention comprises multiple wiring resin layers provided with wiring made up of a metallic conductor on an insulating resin substrate, and has an opening on the surface and a bonding pad to permit electric connection with ICs inside said opening;

wherein said wiring board is characterized in having a conductor comprising a lamination of (1) a resin layer comprising the resin where the velocity of dissolving the mixture solution of hydrazine and ethylenediamine mixed at the ratio of 7 to 3 does not exceed 1 μm/min. at a solution temperature of 30° C., (2) a first metallic layer containing at least one of nickel, tin and cobalt, and (3) a second metallic layer different from the metal contained in said first metallic layer.

Furthermore, the present invention provides a wiring board comprising the lamination of a ceramic wiring board using ceramic as an insulating layer and a resin wiring board using resin as an insulating layer to ensure electric connection between the two;

wherein said wiring board is characterized in having a conductor comprising a lamination of (1) a resin layer comprising the resin where the velocity of dissolving the mixture solution of hydrazine and ethylenediamine mixed at the ratio of 7 to 3 does not exceed 1 μm/min. at a solution temperature of 30° C., (2) a first metallic layer containing at least one of nickel, tin and cobalt, and (3) a second metallic layer different from the metal contained in said first metallic layer.

The present invention provides a method for producing a wiring board where wiring with copper as a conductor is provided on the resin substrate; wherein said method comprises;

(1) a step of using aqueous solution containing alkaline metallic hydroxide to form a layer containing amide group by hydrophilic treatment of the surface of the resin substrate made up of the resin where the velocity of dissolving the mixture solution of hydrazine and ethylenediamine mixed at the ratio of 7 to 3 does not exceed 1 μm/min. at a solution temperature of 30° C., (2) a step of causing the metal film having a reduction potential more base than that of copper to be deposited on the layer containing said amide group, (3) a step of causing a metallic oxide film to be deposited on the surface of said metallic film at the interface between said metallic film and said layer containing amide group, and (4) a step of electroless plating on said metallic film, thereby causing copper to be deposited.

FIG. 1 is a cross sectional view of a wiring board. When one type of metal is used on the resin substrate, an amide group-contained layer 12 or a degenerated layer formed by plasma treatment are located on the resin substrate side at the interface between resin substrate 11 and metallic layer 14, while metallic oxide layer 13 is found on the metallic layer side. When more than one type of metal is used on the resin substrate, a second metallic layer is formed on said metallic layer. Especially when the second metal is copper and copper is formed by electroless plating, the first metal has a reduction potential more base than that of copper.

A highly heat-resistant insulating resin substrate related to the present invention includes polyamide resin, polyimide resin, polybenzoxazole, polyamide-imide resin, polybenzimidazole resin, aramid resin, and epoxy resin. Especially when a thick layer of copper is formed by electroless plating, it is preferred to meet the requirement that the velocity of dissolving the mixture solution of hydrazine and ethylenediamine mixed at the ratio of 7 to 3 does not exceed 1 μm/min. at a solution temperature of 30° C.

A highly heat-resistant resin substrate with amide group contained in the skeleton includes polyamide resin and polyamide-imide resin. A highly heat-resistant resin substrate permitting introduction of amide group on the surface by chemical surface treatment includes polyimide resin prepared by dehydration and condensation of acid anhydride and amine, and polybenzoxazole prepared by heating and dehydration of polyamide. For the resin without functional group serving as an amide group, for example, polyethylene and epoxy resin, amide group can be generated by introduction of carboxyl group on the surface by strong acid treatment and by reaction of it with amine. Evaluation of adhesion with metal plated thereon subsequent to surface modification for generation of amide group or plasma treatment has revealed that polyimide resin exhibits an especially high adhesion. This shows that polyimide resin is particularly preferred as a resin substrate.

In the case of plasma treatment, surface shape generally depends on the type of reaction gas to be used. Independently of whether reaction gas to be used is oxygen or nitrogen, adhesion is higher when the average roughness at the centerline on the surface of the degenerated layer is 0.1 μm or more. It has been possible to get close adhesion capable of withstanding the practical process where the peeling strength in the pull-put peel test at 90 deg. is 500 N/m or more at a temperature of 25° C. This suggests that oxygen and nitrogen are preferred as reaction gas. From the view point of adhesion, plasma treatment is preferred to be carried out to ensure that average roughness at the centerline on the treated surface on the surface of the degenerated layer including the amide group to be formed will be 0.1 μm or more. On the other hand, if the resin substrate surface is roughened to the extent to which the average roughness at the centerline reaches 1.0 μm or more, uneven spots of wiring cannot be ignored when creating a fine wiring with a line/space interval of 10 to 40 μm, preferably 15 to 30 μm, in particular, about 20 μm. The degenerated layer itself is embrittled. To avoid such problems, the average roughness at the centerline is preferred to be 0.1 μm or more, and 1.0 μm (inclusive) to 0.15 through 0.35 μm.

Nickel, cobalt, titanium and chromium can be cited as examples of the metal having a reduction potential more base than that of copper. The metallic layer and copper can be deposited by sputtering, but use of electroless plating is preferred to create a wiring pattern using the full additive method suited for formation of fine wiring. Said metallic oxide layer can be formed by causing a thin layer of said metal to be deposited on the resin substrate in advance and by subsequent oxidation thereof. Or it can be formed by allowing said metal to be deposited on only one side of the resin substrate and putting it in oxygen atmosphere to supply oxygen to the interface through the resin substrate. Interaction between the surface of the resin substrate subjected to amide group generation and metallic oxide layer requires that they are placed in contact with each other. It does not require particular thickness thereof.

Copper on the top layer can be formed by sputtering or electroplating. However, use of electroless plating is preferred when a wiring board is produced according to full additive method.

A wiring pattern can be produced by (1) so-called subtract method where the wiring pattern is created by etching with a proper resist after metal is deposited on the entire resin substrate, (2) a semi-additive method where resist is applied after a thin layer of of metallic film having been plated on the entire resin substrate, and a thick layer of metal is plated by electroplating or electroless plating, followed by a step of etching out the unwanted portion of the thin layer of metallic film, or (3) a full additive method where conductive wiring is created by plating a thick layer of metal by electroplating or electroless plating after resist has been applied.

To generate a wiring board according to the full additive method, the following process can also be considered: After plating catalyst has been applied to the entire plasma-treated resin substrate, light sensitive dry film is laminated on the resin substrate surface, or light sensitive insulating resin coating solution is coated and dried, and plated resist is formed by exposure and development. Post-exposure and development will be performed if required. Then a metallic layer of the metal having a reduction potential more base than that of copper is formed by electroless plating. An oxide layer is formed at the interface between said metallic layer and said resin substrate by heat treatment carried out after formation of this metallic layer. After removal of the oxide film from the surface of said metallic layer with dilute hydrochloric acid, it is put into an electroless copper plating bath to plate a required volume of copper, thereby completing production of a copper wiring board.

A wiring layer can be laminated by repetition of a step of coating the insulating resin coating solution on the conductive wire and drying it and a step of forming the conductive wiring. The insulating layer is made flat by grinding, as required. When an insulating resin film is used as an insulating layer, conductive wiring is formed on the resin film and conductive wiring sheet is created. Another conductive wiring sheet is laminated thereon with an adequate adhesive sheet held in-between, and heat and pressure is applied, thereby completing lamination. Electric connection between layers can be easily achieved by formation of a via-hole with laser beam and by plating inside the via-hole or filling of conductive paste.

Depending on the purpose of use, the wiring board according to the present invention can be used as a flexible wiring board independently by itself, or can be used as a rigid wiring board when it is mounted on the ceramic or glass plate or silicon wafer. Furthermore, it can be used as an integral wiring board when the wiring board according to the present invention is mounted on the ceramic wiring board, and electric connection between the two is provided. Still further, wiring board according to the present invention allows easy mounting of multiple ICs on the surface; therefore, it can be used as a multi-chip module board. Especially, this is suited as a multi-chip module board where multiple ICs are mounted, since formation of fine copper wiring is ensured by full additive method.

The inventors of the present invention have found out that adhesion is improved by specific functional group and metallic oxide.

When polyimide is treated by alkaline aqueous solution, imide ring is opened close to the surface, and amide group is formed. This has been confirmed by measurement of total reflection infrared absorption spectrum. FIG. 2 shows the total reflection infrared absorption spectrum before and after treatment when Kapton 200H by Dupont is used as polyimide. FIG. 3 shows the difference spectrum. New absorption belts appear in the vicinity of 1650 and 1550 cm$^{-1}$ by surface treatment. They are attributable to amide I and amide II absorption belts, respectively. It can be seen from the changes in the spectrum that the imide ring is open and an amide group is formed. Plating catalyst (HS-101B by Hitachi Kasei) is added on this surface, and electroless copper plating solution (CUST-2000 by Hitachi Kasei) is used to carry out copper plating. The temperature of plating solution was 40° C. and plating time was 3 sec. After sufficient drying by vacuum drying subsequent to plating, the test piece was discharged into the air for 24 hours. FIG. 4 shows the changes in said difference spectrum before and after plating. A clear change was observed on amide I and amide II absorption belts before and after plating. This change clearly shows presence of interaction between amide group and copper plated film.

About 30 nm of copper film was deposited on the surface-treated polyimide by said electroless copper plating. A thick layer of about 20 μm of copper was deposited by copper electroplating. Adhesion was evaluated in a peel test. Immediately after copper electroplating, there was almost no peeling strength. When it was left to stand in air, there was a considerable improvement of adhesion with time. Especially when left in the oxygen atmosphere after vacuum drying immediately after copper electroplating, a conspicuous increase in the peeling strength was observed. FIG. 5 shows the secular change of the peeling strength. This result clearly shows that, if copper oxide film is formed at the interface between polyimide and plated steel film, there is a considerable improvement in adhesion of the both. Therefore, a very strong interaction is applied between the amide group and copper oxide, and adhesion is applied. The same result was observed in other types of polyimide and metal except for copper, for example, in the combination of nickel, cobalt and titanium. Furthermore, this result is not restricted to polyimide resin. It was observed in other resins, for example, in polybenzoxazole, polyimide resin and benzimidazole. Namely, it has been found out that the same result can be obtained from introduction of the amide group on the surface of the resin by hydrolyzation.

Authors of the present invention have found out in the peel test that, similarly to the layer containing said amide group, a very strong interaction is applied between the degenerated layer formed by plasma treatment and metallic oxide film; therefore, a very powerful adhesion is ensured.

The authors of the present invention has found out a drastic improvement of adhesion between the resin material and said metallic layer resulting from formation of oxide layer of said metal at the interface, subsequent to formation of the metallic layer of the metal having a reduction potential more base than that of copper by introduction of amide group into the surface of resin material or plasma treatment. They have also found out that a thick layer of copper can be formed on this metallic layer by electroless plating, subsequent to creation of interface of such high adhesion.

Resin material featuring excellent heat resistance, dimensional stability and dielectric characteristics is suitable as a substrate material when using polyimide resin in the wiring board. An important point is that it has an excellent alkali resistance. In the electroless copper plating bath, reaction must take place wherein that reducing agent such as formaldehyde is oxidized on the surface of metallic copper. Alkalinity is essential for this reaction to take place. This means that wiring substrate material is exposed to alkaline solution for a long time. If alkali resistance is low, the substrate as a basis is melted during electroless copper plating, and plated copper film is separated. This has been observed in the study by the authors of the present invention. So they studies the relationship between alkali resistance and electroless copper plating resistance. Etching velocity in the mixture solution of hydrazine and ethylenediamine (70 to 30% by weight) kept at a solution temperature of 30° C. was used as an index to show alkali resistance. Polyimide resin was used since it provides high polymers having various structures by a combination of diamine and acid anhydride. As a result of this study, it has been confirmed that that the plated film deposited on the substrate does not separate even when plating is carried out for 15 hours or more in electroless copper plating bath of about pH 12 kept at a temperature of 70° C., if the etching velocity does not exceed 1 μm/min. It has been made clear that this condition is not restricted to polyimide resin alone; it is applicable to other resins such as polybenzoxazole, polyamide resin, polyamide-imide resin, polybenzimidazole resin, aramid resin, and epoxy resin.

Then study was made to find out how to get a sufficient adhesion between copper and resin substrate when said resin substrate surface is subjected to electroless copper plating. The substrate surface was modified under various conditions; then vapor deposition of copper was provided about 1 $\mu$m by sputtering. Then a thick layer of copper was provided by electroplating until a film thickness of 20 $\mu$m was reached, and the peeling strength was evaluated. This study has shown that effective methods are provided by treatment of the resin substrate surface with alkaline solution, and by surface treatment through plasma treatment using oxygen and nitrogen as reaction gas. Especially when plasma treatment is used, a very high adhesion was ensured by formation of an uneven spot of 0.1 $\mu$m or more with the average roughness (Ra) at the centerline on the resin substrate surface. For example, peeling strength in 90-deg. pull-out peel test at 25° C. is 500 N/m or more. It has become possible to get close adhesion capable of withstanding actual wiring board production process.

Plating catalyst was added to the resin substrate provided with said surface modification, and the substrate was plated in an electroless copper plating bath. Despite the pH value of 10 to 13 and plating bath temperature of 20 to 80° C., the plated film was separated when copper film was about 30 nm or less. When electroless copper plating of a thick layer was conducted after flash electroless copper plating of a thin layer, the plated film was separated immediately after electroless copper plating of a thick layer, with the result that a thick layer of plating failed. Thus, it has been found out that adhesion between the modified resin substrate surface and copper is considerably reduced in electroless copper plating bath. So various studies have been made to examine electroless copper plating after application of metallic film other than copper on the resin substrate surface. It has been revealed that separation of plated film does not take place during plating by performing electroless copper plating after application of metallic film of nickel, tin and cobalt. Study of various types of metals has shown that it is effective to apply the metal having a reduction potential more base than that of copper in advance. At the same time, it has been shown that adhesion between the resin substrate and metallic film is considerably improved through formation of metallic oxide film between the resin substrate and metallic film by placing resin substrate in the oxidation atmosphere after deposition of metallic film on said resin substrate. For example, the surface of polyimide resin substrate was treated with alkaline solution, and a film thickness of about 1 $\mu$m of nickel was deposited on that surface by electroless plating. Then a thick layer of copper was deposited on the nickel to a film thickness of about 20 $\mu$m by electroless copper plating, thereby evaluating the adhesion between polyimide and nickel. Comparison of the peeling strength between the sample provided with annealing in the atmosphere at 180° C. for two hours after nickel plating and untreated sample shows 900 N/m and 300 N/m, respectively. Improvement of adhesion by annealing after plating was also observed when plasma treatment was conducted as resin surface treatment. This is considered to be due to chemical interaction with the surface of the resin where oxide at adhesive interface contains amide group or the surface of the plasma treated resin.

As a result of the above studies, the authors of the present invention have completed the present invention by finding out that a thick layer of copper film can be formed on said metallic layer by electroless copper plating by taking the following steps: (1) the resin where the velocity of dissolving the mixture solution of hydrazine and ethylenediamine mixed at the ratio of 7 to 3 does not exceed 1 $\mu$m/min. at a solution temperature of 30° C., was used as a resin substrate; (2) amide group was introduced into the surface of resin material or plasma treatment was conducted; (3) the metal having a reduction potential more base than that of copper was deposited on the treated surface; and (4) oxide layer of said metal was formed at the interface between said resin substrate and said metal layer.

Furthermore, the authors of the present invention have found out that fine copper wiring having a line/space pattern of about 20 $\mu$m with a film thickness of of about 20 $\mu$m and with a high aspect ratio can be formed on the resin substrate by the following steps: (1) Catalyst is applied to the resin substrate where amide group is introduced or plasma treatment is made; (2) then dry film is laminated thereon; (3) then plated resist is formed by exposure and development. For example, after nickel is deposited by electroless plating, nickel oxide film is formed at the interface between resin substrate and nickel by baking in the atmosphere. After nickel oxide film is removed from the surface it is put into the electroless copper plating bath to provide a thick layer of copper.

The present invention provides highly reliable wiring boards characterized by excellent adhesion between conductive metal and resin substrate, and superb heat resistance. This provides fine wiring having a required thickness with a line width of 40 $\mu$m or less.

A highly reliable multi-chip module featuring excellent heat resistance is provided by forming a laminated board through lamination of said multiple wiring boards wherein electric connection is made between layers, and a connection port with ICs is provided on the outermost surface to mount the ICs.

Figure 1:
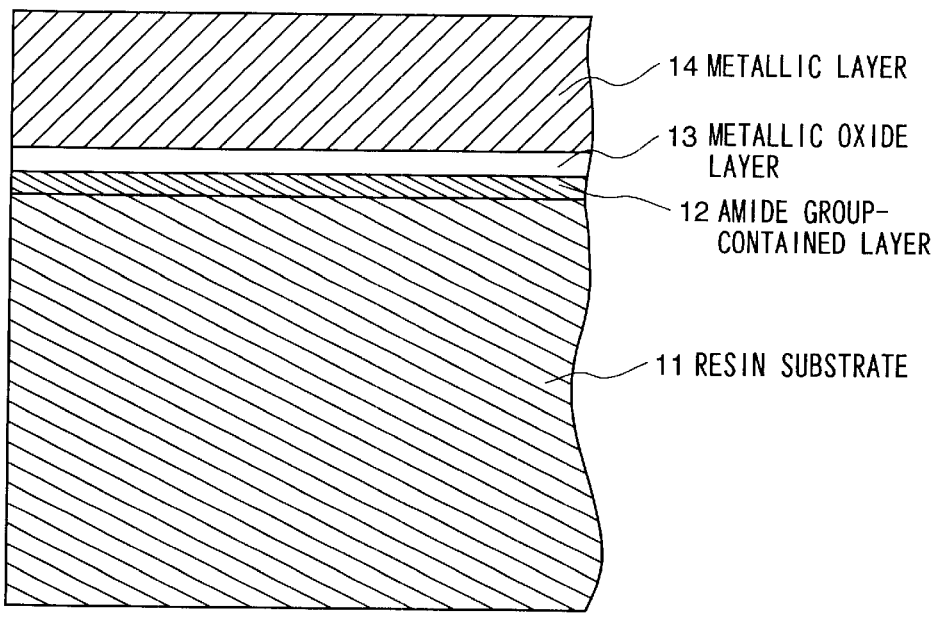
FIG. 1 is a cross sectional view representing the configuration of a wiring board.
Figure 5:
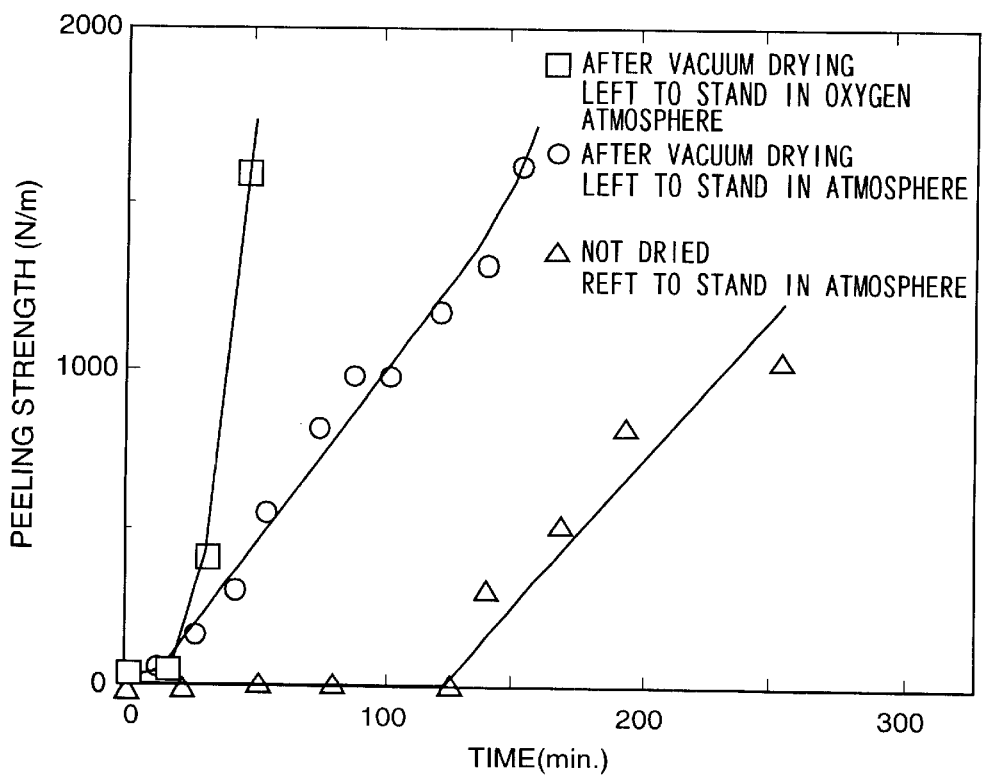
FIG. 5 is a view representing the change of peeling strength with time after electroplating of copper on Kapton 200H.
Figure 2:
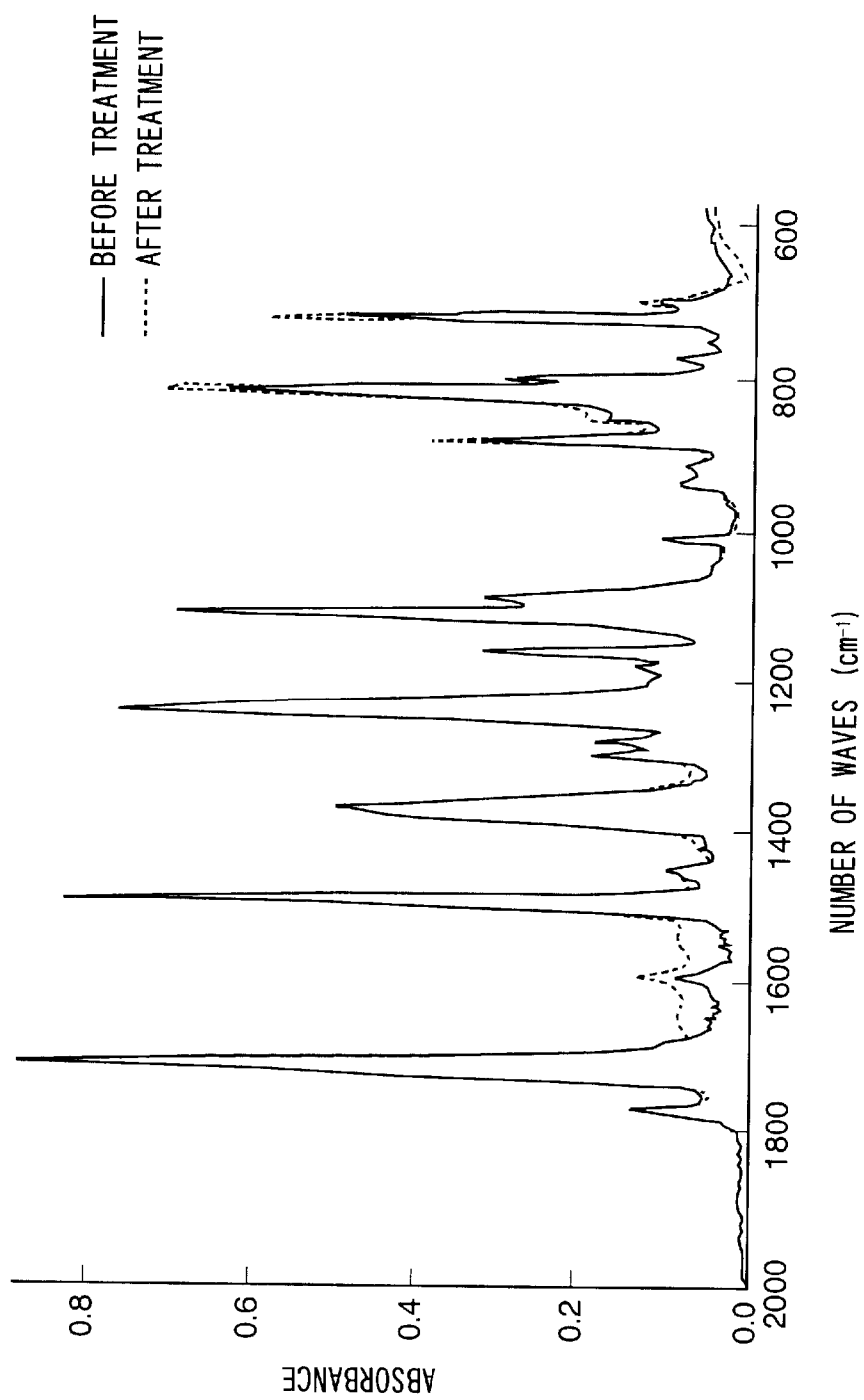
FIG. 2 is a view representing the total reflection infrared absorption spectrum before and after treatment of Kapton 200H.
Figure 3:
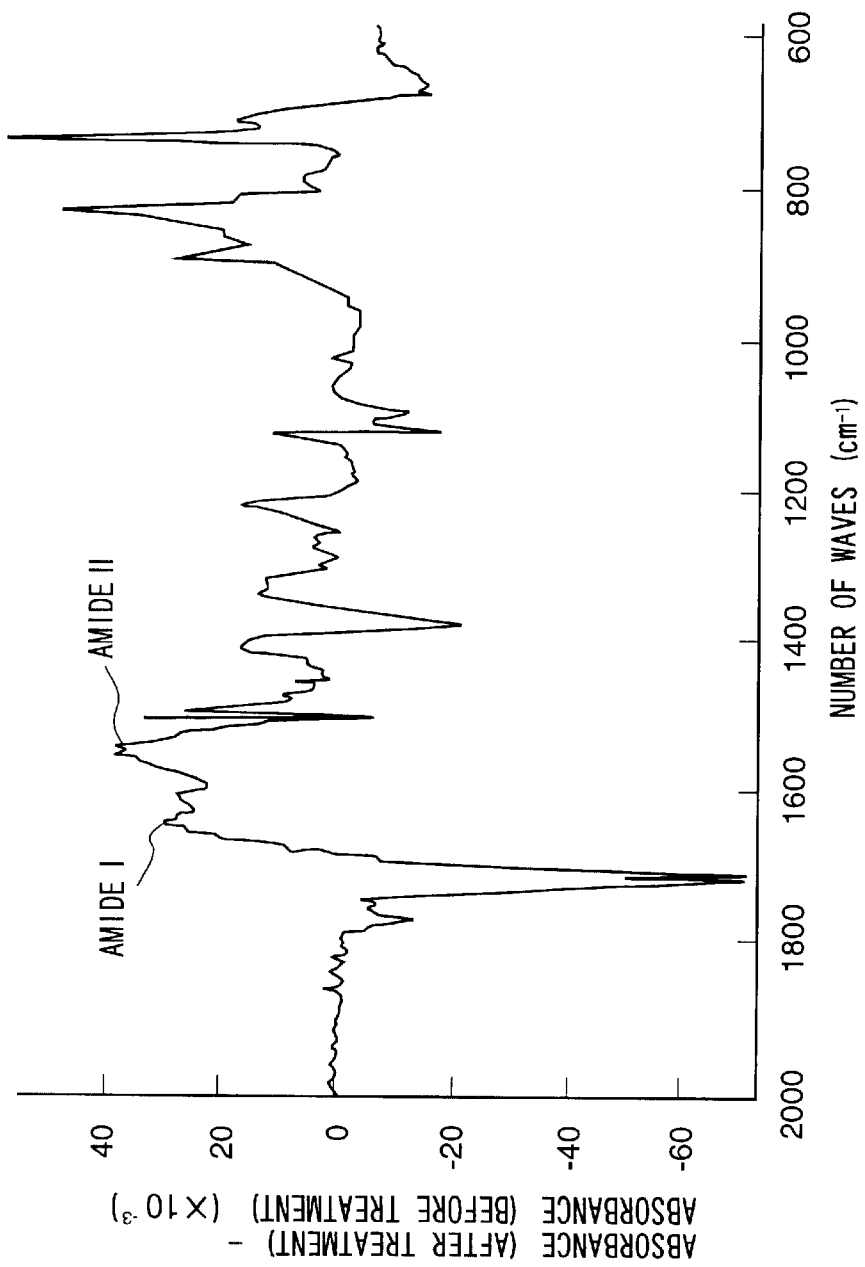
FIG. 3 is a view representing the difference spectrum.
Figure 4:
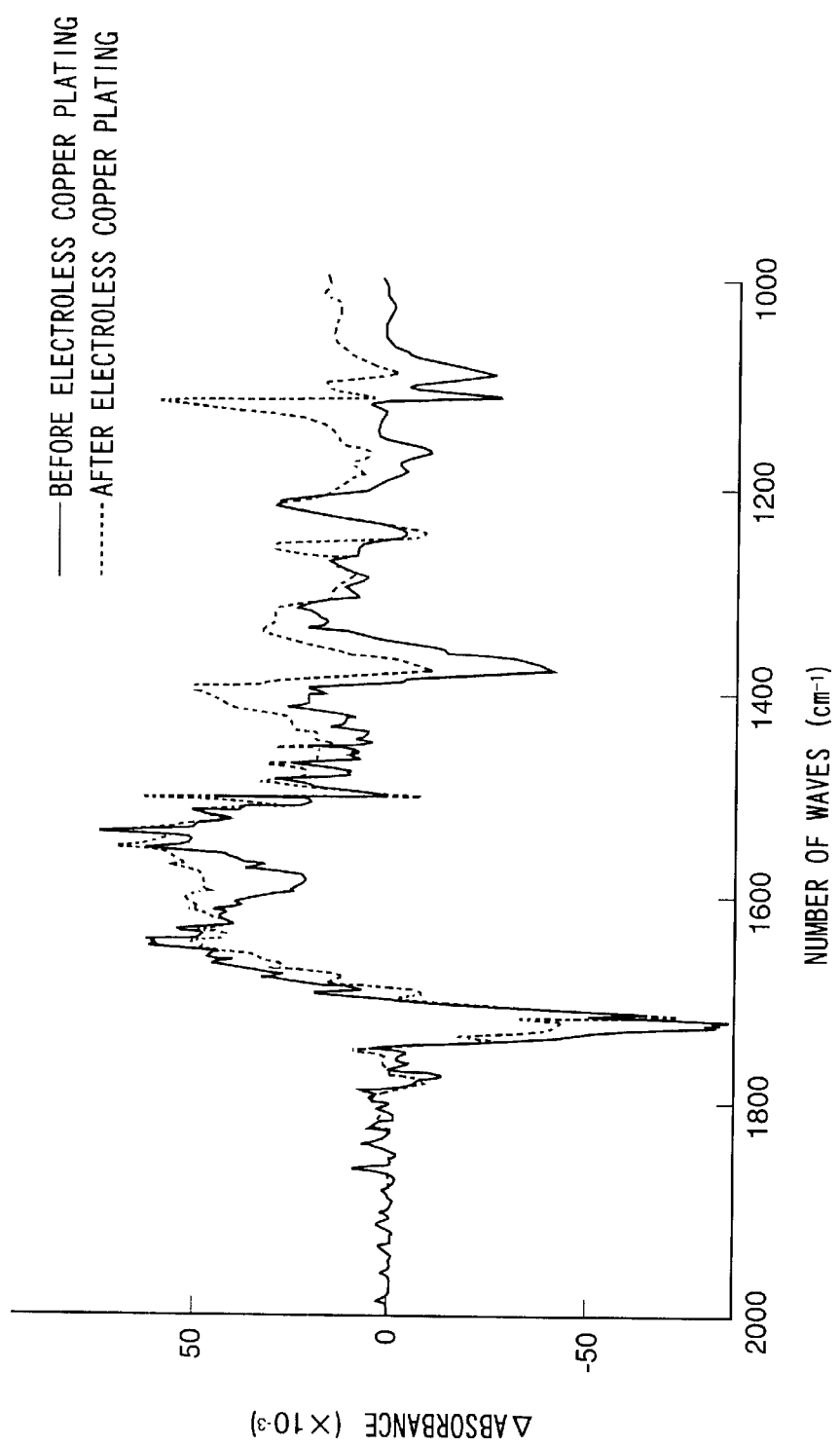
FIG. 4 is a view representing the total reflection infrared absorption difference spectrum before and after plating of Kapton 200H.

The following illustrates the symbols and numerals used in the drawings:

11 ... Resin substrate, 12 ... Layer with amide group or degenerated layer formed by plasma treatment, 13 ... Metallic oxide layers, 14 ... Metallic layer, 21, 33 ... Coppers, 22 ... Resin plate, 23, 32 ... Polyimide layers 24, 37 ... Resist, 25, 34 ... Nickel, 26, 44 ... copper paste, 31 ... Silicon wafer board, 35 ... Polyimide film, 36, 42 ... Adhesive film, 41 ... Single sided wiring sheet, 43 ... Ceramic substrate, 45 ... Double-sided wiring sheet, 46 ... Surface layer (Cr/Ni/Au), 47 ... Solder ball, 48 ... $LSI_o$.

DESCRIPTION OF THE PREFERRED EMBODIMENTS (Embodiment 1)

Polyimide film resin substrate, Kapton 200H by Dupont having a surface roughness of 0.1 μm or less was used. A 10 cm×10 cm sample was created, and was treated in aqueous solution for surface modification at a liquid temperature of 25° C. for 2 minutes.

[Composition of aqueous solution for surface modification]

Sodium hydroxide 100 g/l

Ethylene diamine 70 g/l

Ethanol 100 g/l

A treated sample was bonded on the epoxy resin substrate with glass cloth, and was vacuum dried at 25° C. for 3 hours. Then the sample surface was pressed against the germanium prism to measure total reflection infrared absorption. Then absorption peak specific to amide group was observed in the vicinity of 1650 $cm^{-1}$ and 1550 $cm^{-1}$, in addition to absorption peak in the vicinity of 1780 $cm^{-1}$ and 1720 $cm^{-1}$ which were attributable to the carbonyl group of the imide ring. This shows that amide group is introduced on the surface by this surface treatment. This sample was subjected to plating catalyst treatment according to the specified method using the circuit breakers 3040, 3340 and 4041 by Japan Mining. Then electroless copper plating solution (CUST-2000 by Hitachi Kasei) for thin plating was used to carry out plating. The film thickness was about 30 nm. After having been washed in running water, the sample was vacuum dried at 25° C. for three hours. Then the sample was placed in oxygen flow for one hour. X-ray was irradiated from the resin substrate side of the sample at a low angle to measure diffraction spectrum and to check the interface between the resin substrate and copper film, thereby verifying presence of copper oxide at the interface. Then the copper film was subjected to electroless copper plating at a current density of 15 mA/$cm^2$ to a film thickness of about 20 μm.

[Composition of electroless copper plating solution]

Copper sulfate pentahydrate 0.80 mol/l

Sulfuric acid 0.54 mol/l

Sodium chloride 0.0014 mol/l

After electroless copper plating, the sample was washed in running water, and was then vacuum dried at 25° C. for three hours. The sample was separated from the epoxy resin substrate with glass cloth. A peel test was conducted wherein the copper film side was fixed to the silicon wafer by a double-coated tape, and the polyimide film side was separated. Separation in the peel test was found out at the interface between polyimide and copper film. The peeling strength was 1.2 kN/m, which indicated a very high adhesion. This resin substrate was left to stand in nitrogen atmosphere at 300° C. for one hour. The peeling strength found out in the peel test was about 1.1 kN/m, exhibiting almost no change. Furthermore, this resin substrate was left to stand in atmosphere at 150° C. for 1000 hours; then a peel test was conducted. The peeling strength was about 0.9 kN/m which indicated a very high adhesion. This shows that a very high reliability in thermal stability is ensured when this substrate is used as electric parts.

(Embodiment 2)

Kapton 200H by Dupont was used as Polyimide film. A 10 cm×10 cm sample was created, and was treated in aqueous solution for surface modification (the same one used in the First Embodiment) at a liquid temperature of 25° C. for 2 minutes. After treatment, the sample was bonded on a glass epoxy resin substrate, and was subjected to plating catalyst treatment according to the specified method using the circuit breakers 3040, 3340 and 4041 by Japan Mining. Then electroless nickel plating solution (B-1 by Okuno Seiyaku) was used to deposit nickel to a film thickness of about 0.1 μm. After plating, the sample was separated from glass epoxy resin substrate, and was left to stand in the flow of oxygen for one hour after having been vacuum dried for three hours while kept heated to a temperature of 40° C. X-ray was irradiated from the polyimide film side at a low angle to measure diffraction spectrum and to check the interface between the polyimide film and nickel film, thereby verifying presence of nickel oxide at the interface. Then the nickel film was subjected to electroless copper plating to a film thickness of about 20 μm. The copper electroplating solution composition and plating conditions were the same as those used in the First Embodiment. The sample was left to stand in the flow of oxygen for one hour after having been vacuum dried for three hours while kept heated to a temperature of 40° C. Then the sample was subject to peel test, in the same way as in the First Embodiment. As a result, the peeling strength was about 1.6 kN/m which indicated a very high adhesion. This substrate sample was left to stand in nitrogen atmosphere at 300° C. for one hour. The peeling strength found out in the peel test was about 1.5 kN/m, exhibiting almost no change. Furthermore, this resin substrate was left to stand in atmosphere at 150° C. for 1000 hours; then a peel test was conducted. The peeling strength was about 1.3 kN/m which indicated a very high adhesion. This shows that a very high reliability in thermal stability is ensured when this substrate is used as electric parts.

(Embodiment 3)

Kapton 200H by Dupont was used as Polyimide film. Four 5 cm×5 cm samples were created, and was treated in aqueous solution for surface modification (the same one used in the First Embodiment) at a liquid temperature of 25° C. for 2 minutes.

After treatment, the sample was bonded on a glass epoxy resin substrate, and was vacuum dried 25° C. for three hours. Then cobalt, tin, copper and nickel were deposited on the sample by sputtering to a thickness of about 1 μm. After that, the sample was separated from glass epoxy resin substrate, and was left to stand in the flow of oxygen for one hour. X-ray was irradiated from the polyimide film side at a low angle to measure diffraction spectrum and to check the interface between the polyimide film and metallic film, thereby verifying presence of oxides at the interface for any metal samples. Copper was then deposited on each sputtered metal film by copper electroplating to a film thickness of about 20 μm under the same conditions as First Embodiment.

After copper electroplating, the sample was vacuum dried 25° C. for three hours. The copper film was fixed to the silicon wafer by a double-coated tape, and a peel test was conducted to separate the polyimide film side. Separation in the peel test was found out at the interface between polyimide and metallic film in the case of any sample. The peeling strength of cobalt, tin, copper and nickel materials found out in the peel test was 1.5 kN/m, 1.4 kN/m, 1.2 kN/m and 1.6 kN/m, respectively, which indicated a very high adhesion. These substrate samples were left to stand in nitrogen atmosphere at 300° C. for one hour. The peeling strength found out in the peel test was 1.4 kN/m, 1.4 kN/m, 1.0 kN/m and 1.5 kN/m, exhibiting almost no change. Furthermore, these substrate samples were left to stand in atmosphere at 150° C. for 1000 hours; then a peel test was conducted. The peeling strength was 0.8 kN/m in all cases, retaining a very high adhesion. This shows that a very high reliability in thermal stability is ensured when this substrate is used as electric parts.

(Embodiment 4)

9.1 pts. wt. of 4,4'-dihydroxy-m-benzine was dissolved in 50 pts. wt. of dimethylacetoamide/pyridine solvent (1:1 in weight percent), and 10 pts. wt. of isophthaloyl chloride was dissolved in 50 pts. wt. of cyclohexanone. The latter solution was slowly dropped into the latter solution. It was dissolved in N-methylpyrrolidone after separation of generated solids, and the viscosity of this varnish was adjusted to about 50 poises. A 10 $\mu$m membrane filter was used to filter it by pressure to remove fine components. This varnish was applied to the glass substrate by spin coating method and was heated at 100° C. for one hour. Then it was separated from the glass substrate to get the film. The film thickness was 40 $\mu$m. After it was fixed by an iron frame, temperature was raised continuously from 100° C. to 400° C. in nitrogen gas atmosphere for 90 minutes to get polybenzoxazole film through dehydration and condensation. A 10 cm×10 cm sample was created from this film, and was treated in aqueous solution for surface modification described in the First Embodiment at a liquid temperature of 70° C. for 5 minutes. After treatment, the sample was pressed against the germanium prism to measure surface infrared absorption spectrum by means of the FT-IR measuring equipment (System 2000 by Perkin Elmer) according to multiple reflection ATR method. This test has verified that the amide group is generated on the surface. The sample was bonded on a glass epoxy resin substrate, and was subjected to plating catalyst treatment according to the method specified in the First Embodiment. Then similarly to the case of the First Embodiment, electroless copper plating solution (CUST-2000 by Hitachi Kasei) was used to carry out plating at a liquid temperature of 40° C. for two minutes. The film thickness was 30 nm. The sample was separated from glass epoxy resin substrate, and was left to stand in the flow of oxygen for one hour after having been vacuum dried for three hours while kept heated to a temperature of 40° C. X-ray was irradiated from the resin substrate side of the sample at a low angle to measure diffraction spectrum and to check the interface between the resin substrate and copper film, thereby verifying presence of copper oxide at the interface. Then copper was deposited by electroless copper plating to a film thickness of about 20 $\mu$m. The copper electroplating solution composition and plating conditions were the same as those used in the First Embodiment. The resin film side was fixed to the silicon wafer by a double-coated tape, and a peel test was conducted to separate the copper film. As a result, the peeling strength was about 1.1 kN/m, which indicated a very high adhesion. Furthermore, the substrate sample was left to stand in nitrogen atmosphere at 300° C. for one hour. The peeling strength found out in the peel test was 1.0 kN/m, exhibiting almost no change. Furthermore, the substrate sample was left to stand in atmosphere at 150° C. for 1000 hours; then a peel test was conducted. The peeling strength was 0.9 kN/m, retaining a very high adhesion. This shows that a very high reliability in thermal stability is ensured when this substrate is used as electric parts.

(Embodiment 5)

The epoxy resin substrate with glass cloth was subjected to oxygen plasma treatment by a dry etching apparatus (DEA-506 by Anerva) at a pressure of 3 Pa and at a flow rate of 25 SCCM. Plasma output was 800 W and treatment was continued for 45 minutes. It was then treated for five minutes in chromic acid/sulfuric acid aqueous solution (5 parts of $CrO_3$, 100 parts of sulfuric acid, 10 parts of water) having a liquid temperature of 50° C. After that, it was washed in water; then it was dipped in ethylenediamine for 5 minutes and was washed sufficiently in water. The epoxy substrate surface after treatment was subjected to total reflection infrared absorption, and absorption peak identified as amide group was observed in the vicinity of 1650 $cm^{-1}$ and 1550 $cm^{-1}$. This shows that amide group is introduced on the surface by this treatment. Three of treated substrates were prepared, and thin layers of titanium, chromium and tungsten (about 50 nm thick) were deposited thereon by sputtering through a mask with line/space formed at an interval of 5 mm/5 mm. The sample was then heated at 180° C. for 2 hours, and various metallic films were formed at the interface between epoxy resin substrate and various metallic films. Under the same conditions as First Embodiment, copper was deposited on various metallic films to a thickness of 20 $\mu$m by copper electroplating. Then a peel test was conducted to separate the copper film. Separation in the peel test was found out at the interface between the epoxy substrate and metallic films in the case of any sample. The peeling strength of of titanium, chromium and tungsten samples found out in the peel test was 0.7 kN/m, 0.6 kN/m and 0.6 kN/m, respectively, which indicated a very high adhesion. These substrate samples were left to stand in nitrogen atmosphere at 300° C. for one hour. Then the peeling strength found out in the peel test exhibited almost no change. Furthermore, these substrate samples were left to stand in atmosphere at 150° C. for 1000 hours; then a peel test was conducted. The peeling strength was 0.5 kN/m in all cases, retaining a very high adhesion. This shows that a very high reliability in thermal stability is ensured when this substrate is used as electric parts.

Comparative Example 1

Kapton 200H by Dupont was used as polyimide film similarly to the case of First Embodiment, and 10 cm×10 cm sample was created. The sample was bonded on a glass epoxy resin substrate, and was washed sufficiently in water. It was then subjected to the processes ranging from plating catalyst treatment to electroless copper plating according to the method specified in the First Embodiment. The film thickness was 30 nm. The sample was separated from glass epoxy resin substrate immediately after plating, and copper was deposited thereon by copper electroplating under the same conditions as the First Embodiment. In about ten minutes after start of plating, part of the copper plated film started to separate from the end, and the entire plated film was separated completely in about 30 minutes.

Comparative Example 2

Kapton 200H by Dupont was used as polyimide film similarly to the case of First Embodiment, and 10 cm×10 cm sample was created. The sample was bonded on a glass epoxy resin substrate, and was washed sufficiently in water. It was then subjected to the processes ranging from surface treatment, plating catalyst treatment and electroless copper plating according to the method specified in the First Embodiment. The film thickness was 30 nm. The sample was separated from glass epoxy resin substrate immediately after plating, and copper was deposited thereon to a film thickness of 20 µm by copper electroplating under the same conditions as the First Embodiment. Part of the copper plated film separated from the end during electroplating. After plating, the peeling strength of the unplated portion was measured in the same manner as specified in the First Embodiment. The result was about 30 N/m, which indicated a very small adhesion. The sample was put in a globe box filled with nitrogen gas and was separated into polyimide film and copper plated film. X-ray diffraction was irradiated to check the surface of the copper plated side. As a result, no copper oxide was observed at the interface.

Comparative Example 3

Kapton 200H by Dupont was used as polyimide film similarly to the case of First Embodiment, and 10 cm×10 cm sample was created. The sample was bonded on a glass epoxy resin substrate, and was washed sufficiently in water. It was then subjected to plating catalyst treatment in the same manner as specified in the First Embodiment, without surface treatment. The sample was then subjected to electroless plating in the same manner as specified in the First Embodiment. Copper was deposited thereon to a film thickness of about 30 nm by copper electroplating. The sample was washed in running water, and was then vacuum dried at 25° C. for three hours. The sample was left to stand in the flow of oxygen for one hour. X-ray was irradiated from the polyimide film side of the sample at a low angle to measure diffraction spectrum and to check the interface between the resin substrate and copper film, thereby verifying presence of copper oxide at the interface. In the same manner as specified in the First Embodiment, copper was deposited thereon to a thickness of about 20 µm by copper electroplating. After copper electroplating, the sample was washed sufficiently in running water, and was then vacuum dried at 25° C. for three hours. The sample was separated from the epoxy resin substrate with glass cloth. A peel test was conducted wherein the copper film side was fixed to the silicon wafer by a double-coated tape, and the polyimide film side was separated. Separation in the peel test was found out at the interface between polyimide and copper film. The peeling strength was 0.1 kN/m, which indicated a very low adhesion.

The above finding indicates that presence of amide group on the resin surface and presence of oxide film at the boundary on the metal side are essential to get a high adhesion at the interface between the resin and metal.

(Embodiment 6)

Upilex-25S by Ube Industries, Ltd. was used as a resin substrate comprising polyimide film. Two 10 cm×10 cm samples were created and were subjected to oxygen plasma treatment by a dry etching apparatus (DEA-506 by Anerva) at a pressure of 3 Pa and at a flow rate of 25 SCCM. Plasma output was 800 W and treatment was continued for 25 minutes. The treated sample was bonded on a glass epoxy resin substrate, and was then subjected to plating catalyst treatment in the same manner as specified in the First Embodiment. Then electroless nickel plating solution (B-1 by Okuno Seiyaku) was used to deposit nickel to a film thickness of about 1 µm. Copper was deposited on the nickel film to a thickness of about 20 µm by electroless copper plating under the same conditions as the First Embodiment. Then one sample was placed in a vacuum drier was vacuum baked at 180° C. for two hours. Another sample was also placed in the atmosphere and was baked at 180° C. for two hours. After backing, a peel test was conducted wherein the copper film sides of two samples were fixed to the silicon wafer by double-coated tape, and the polyimide was pulled upward by 90 deg. at 25° C. to be separated. As a result, the peeling strength was about 300 N/m for the vacuum baked sample, and about 900 N/m for the sample baked in the atmosphere; a big difference was observed between the two. This indicates that adhesion is improved by formation of nickel oxide film at the interface between the polyimide and nickel film.

(Embodiment 7)

A polybenzoxazole film was formed in the same manner as specified in the Fourth Embodiment. Four 5 cm×5 cm samples were created from this film, and were subjected to plasma treatment by a dry etching apparatus (DEA-506 by Anerva) using nitrogen as reaction gas. Plasma treatment was carried out at a pressure of 3 Pa and at a flow rate of 25 SCCM for 25 minutes with an output of 800 W. After treatment, the sample was bonded on a glass epoxy resin substrate with glass cloth. Then titanium, cobalt, tin and nickel were deposited thereon by sputtering to a thickness of about 1 µm. The sample was then separated from the epoxy resin substrate and was placed in the flow of oxygen for one hour. X-ray was irradiated from the polybenzoxazole film side of the samples at a low angle to measure diffraction spectrum and to check the interface between polybenzoxazole film and metal film, thereby verifying presence of oxide at the interface for any metal samples. After that, copper was then deposited on each sputtered metal film by copper electroplating to a film thickness of about 20 µm under the same conditions as First Embodiment. After copper electroplating, the sample was vacuum dried 25° C. for three hours. The copper film was fixed to the silicon wafer by a double-coated tape, and a peel test was conducted to separate the polybenzoxazole film side. Separation in the peel test was found out at the interface between polybenzoxazole and various metallic films in the case of any sample. The peeling strength of titanium, cobalt, tin and nickel materials was. 0.6 kN/m, 0.8 kN/m, 0.8 kN/m and 1.0 kN/m, respectively, which indicated a very high adhesion. Furthermore, these substrate samples were left to stand in nitrogen atmosphere at 300° C. for one hour. The peeling strength found out in the peel test exhibited almost no change. Furthermore, these substrate samples were left to stand in atmosphere at 150° C. for 1000 hours; then a peel test was conducted. The peeling strength was 0.5 kN/m in all cases, retaining a very high adhesion. This shows that a very high reliability in thermal stability is ensured when this substrate is used as electric parts.

(Embodiment 8)

Polybenzoxazole film was obtained in the same manner as specified in the Fourth Embodiment. A 10 cm×10 cm sample was created from this film, and was subjected to plasma treatment by a dry etching apparatus (DEA-506 by Anerva) using argon, oxygen and nitrogen as reaction gas. Plasma treatment was carried out at a pressure of 3 Pa and at a flow rate of 25 SCCM for 25 minutes with an output of 800 W.

60. The sample was bonded on a glass epoxy resin substrate, and was subjected to plating catalyst treatment according to the specified method using the circuit breakers 3040, 3340 and 4041 by Japan Mining. Then electroless nickel plating solution (Top Chemialloy B-1 by Okuno Seiyaku) was used to deposit nickel to a film thickness of about 1.0 µm. The sample was separated from glass epoxy resin substrate, and was left to stand in the flow of oxygen for one hour after having been vacuum dried for three hours while kept heated to a temperature of 40° C. X-ray was irradiated from the resin film side at a low angle to measure diffraction spectrum and to check the interface between the resin film and nickel film, thereby verifying presence of nickel oxide at the interface. Then copper was deposited thereon to a thickness of about 20 μm by copper electroplating under the same conditions as the First Embodiment. The resin film was fixed to the silicon wafer by a double-coated tape, and a peel test was conducted to separate the copper film. As a result, the peeling strength was 0.6 kN/m, 0.9 kN/m, and 1.0 kN/m when reaction gas is argon, oxygen and nitrogen, respectively, which indicated a very high adhesion. These substrate samples were left to stand in nitrogen atmosphere at 300° C. for one hour. The peeling strength found out in the peel test exhibited almost no change. Furthermore, these substrate samples were left to stand in atmosphere at 150° C. for 1000 hours; then a peel test was conducted. The peeling strength was 0.5 kN/m in all cases, with a very high adhesion retained. This shows that a very high reliability in thermal stability is ensured when this substrate is used as electric parts.

(Embodiment 9)

Upilex 12.5S by Ube Industries, Ltd. was used as a resin substrate. Three 10 cm×10 cm samples were created from this film, and was subjected to oxygen plasma treatment by a dry etching apparatus (DEA-506 by Anerva) using argon, oxygen and nitrogen as reaction gas. Plasma treatment was carried out at a pressure of 3 Pa and at a flow rate of 25 SCCM for 25 minutes with an output of 800 W.

The sample was bonded on a glass epoxy resin substrate, and was subjected to plating catalyst treatment according to the specified method using the circuit breakers 3040, 3340 and 4041 by Japan Mining. Then electroless nickel plating solution (Top Chemialloy B-1 by Okuno Seiyaku) was used to deposit nickel to a film thickness of about 1.0 μm. The sample was separated from glass epoxy resin substrate, and was left to stand in the flow of oxygen for one hour after having been vacuum dried for three hours while kept heated to a temperature of 40° C. X-ray was irradiated from the resin substrate side at a low angle to measure diffraction spectrum and to check the interface between the resin substrate and nickel film, thereby verifying presence of nickel oxide at the interface. Then copper was deposited thereon to a thickness of about 20 μm by copper electroplating under the same conditions as the First Embodiment. The copper film was fixed to the silicon wafer by a double-coated tape, and a peel test was conducted to separate the resin film side. As a result, the peeling strength was 0.8 kN/m, 1.0 kN/m, and 1.2 kN/m when reaction gas is argon, oxygen and nitrogen, respectively, which indicated a very high adhesion. These substrate samples were left to stand in nitrogen atmosphere at 300° C. for one hour. The peeling strength found out in the peel test exhibited almost no change. Furthermore, these substrate samples were left to stand in atmosphere at 150° C. for 1000 hours; then a peel test was conducted. The peeling strength was about 0.6 kN/m in all cases, with a very high adhesion retained. This shows that a very high reliability in thermal stability is ensured when this substrate is used as electric parts.

(Embodiment 10)

p-phenylene diamine (PDA) and 4,4'-diaminephenylether (DDE) were selected as amine serving as material for polyimide. Pyromellitic dianhydride (PMDA), 3,3',4,4'-benzophenone tetracarboxylic dianhydride (BTDA) and 3,3',4,4'-biphenyltetracarboxylic dianhydride (BPDA) were selected as acid anhydride. Both of them in the same number of moles were dissolved in N-methylpyrrolidone and were made to react with each other at about the room temperature for about five hours, thereby synthesizing polyamic acid as a precursor of polyimide. 10 μm membrane filter was used to filter it by pressure to remove fine components. This polyamic acid varnish was applied to the glass substrate by spin coating method and was heated at 100° C. for one hour. Then it was separated from the glass substrate to get the film. After it was fixed by an iron frame, temperature was raised continuously from 100° C. to 400° C. in nitrogen gas atmosphere for 90 minutes to get polyimide film through imide reaction. This film was cut to get a 10 cm×10 cm piece which was used as a sample.

Etching velocity was calculated by measuring the reduction of polyimide film thickness with TALLYSTEP (by Rank Tailor Hobson) when this sample was placed for the specified period of time in a test tube containing about 10 cc of mixture solution of hydrazine and ethylenediamine (70 to 30% by weight) kept at 30° C. However, since polyimide swells due to etching, film thickness was measured after having been dried at 200° C. subsequent to washing in water. The results of this test are given in Table 1. The table also shows the results of evaluating commercially available polyimide films Kapton 200H (by Toray Dupont) and Upilex-25S (by Ube Industries).

TABLE 1

| Polyimide | | Etching | Separation during electroless plating o:Without |
|---|---|---|---|
| Amine | Acid hydride | velocity (μm/min.) | separation x:With separation |
| Synthetic products | PDA | PMDA | 10.3 | x |
| | PDA | BTDA | 0.3 | o |
| | PDA | BPDA | 0.04 | o |
| | DDE | PMDA | 1.5 | x |
| | DDE | BTDA | 0.06 | o |
| | DDE | BPDA | 0.03 | o |
| Commercially available film | Kapton 200H | | 10.1 | x |
| | Upilex 25S | | 0.03 | o |

A 10 cm×10 cm sample was created, and was subjected to oxygen plasma treatment by a dry etching apparatus (DEA-506 by Anerva). Plasma treatment was carried out at a pressure of 3 Pa and at a flow rate of 25 SCCM for 25 minutes with an output of 800 W. After treatment, the sample was bonded on a glass epoxy resin substrate with glass cloth, and was subjected to plating catalyst treatment according to the specified method using the circuit breakers 3040, 3340 and 4041 by Japan Mining. Then electroless nickel plating solution (B-1 by Okuno Seiyaku) was used to deposit nickel to a film thickness of about 1 μm. After plating, the sample was left to stand in the flow of oxygen for one hour. X-ray was irradiated from the resin substrate side of the sample at a low angle to measure diffraction spectrum and to check the interface between the resin substrate and nickel film, thereby verifying presence of nickel oxide at the interface. After having been placed aquatic solution of palladium chloride (1 g/l) for about one minute, it was put in electroless copper plating bath for thick plating. The following shows the composition of electroless copper plating solution for thick plating: Solution was kept at 70° C.

[Composition of electroless copper plating solution for thick plating]
[Composition of electroless copper plating solution]
Copper sulfate pentahydrate 0.04 mol/l
Disodium ethylenediamine tetraacetate 0.1 mol/l
Formaldehyde 0.03 mol/l
Sodium hydroxide 0.1 mol/l
2,2'-bipyridine 0.0002 mol/l
Polyethylene glycol (Average molecular weight) 0.03 mol/l Observation was made to check if the plated film was separated during plating. The result is given in Table 1. Separation was not observed when polyimide film with a slow etching velocity was used. In the case of polyimide film likely to be subjected to etching, however, separation occurred between polyimide and nickel film in about 30 minutes after start of plating. The result in Table 1 shows that separation during electroless plating greatly depends on the alkali resistance of polyimide as substrate. It indicates that separation can be avoided during electroless plating when etching velocity is 1 μm/min. or less.

(Embodiment 11)

A polyimide film formed in the same manner as specified in the Tenth Embodiment was cut into 5 cm×5 cm pieces, and two sheets were prepared for each type of polyimide. Each sheet is subjected to plasma treatment by under the same conditions as the Tenth Embodiment. After that, the sample was bonded on a glass epoxy resin substrate, and copper was deposited on the treated surface by sputtering to a film thickness of about 1 μm.

Copper was also deposited on the untreated surface by sputtering to a film thickness of about 1 μm. All samples were left to stand in the flow of oxygen for one hour. X-ray was irradiated from the polyimide side at a low angle to measure diffraction spectrum and to check the interface between the polyimide and copper film, thereby verifying presence of copper oxide at the interface. X-ray was irradiated from the polyimide side of these samples at a low angle to measure diffraction spectrum and to check the interface between the polyimide and metallic film, thereby verifying presence of copper oxide at the interface in all samples. Copper was then deposited on the films of all samples by copper electroplating to a film thickness of about 20 μm. The composition of copper electroplating solution used is the same as that used in the First Embodiment. The current density was 0.015 A/cm² to a film thickness of about 20 μm. The copper film was fixed to the silicon wafer by a double-coated tape, and a peel test was conducted wherein the side of the polyimide film not covered with copper was pulled upward by 90 deg. at 25° C. to separate the film. The results of this test are given in Table 2. The Table also shows the results of evaluating commercially available polyimide films Kapton 200H (by Toray Dupont) and Upilex-25S (by Ube Industries). A considerable improvement in adhesion was observed in any case of polyimide when oxygen plasma treatment was provided.

TABLE 2

| Polyimide | | | Peeling strength (N/m) | |
|---|---|---|---|---|
| | Amine | Acid hydride | Untreated | Oxygen plasma treatment |
| Synthetic products | PDA | PMDA | 50 | 600 |
| | PDA | BTDA | 100 | 900 |
| | PDA | BPDA | 50 | 600 |
| | DDE | PMDA | 150 | 1300 |
| | DDE | BTDA | 80 | 800 |
| | DDE | BPDA | <30 | 700 |

TABLE 2-continued

| Polyimide | | | Peeling strength (N/m) | |
|---|---|---|---|---|
| | Amine | Acid hydride | Untreated | Oxygen plasma treatment |
| Commercially available film | Kapton 200H | | 50 | 600 |
| | Upilex 25S | | <30 | 700 |

(Embodiment 12)

A polyimide film composed of p-phenylene diamine (PDA) and 3,3',4,4'-biphenyltetracarboxylic dianhydride (BPDA) was obtained according to the method specified in Tenth Embodiment. It was cut into 5 cm×5 cm pieces, and four sheets were prepared. They were subjected to plasma treatment by under the same conditions as the Tenth Embodiment. After that, the samples were bonded on a glass epoxy resin substrate, and were then subjected to plating catalyst treatment in the same manner as specified in the First Embodiment. These films were provided with electroless nickel plating (plated to a film thickness of about 1.0 μm with B-1 by Okuno Seiyaku), electroless cobalt plating (plated to a film thickness of about 0.8 μm with DISCLAD 601 by Okuno Seiyaku), electroless tin plating (plated to a film thickness of about 0.7 μm with SUBSTAR SN-2 by Okuno Seiyaku), and electroless thin copper plating (plated to a film thickness of about 0.3 μm with CUST-2000 by Hitachi Kasei). After plating, samples were baked at 180° C. in the atmosphere in the electric furnace for two hours. X-ray was irradiated from the polyimide side of the samples at a low angle to measure diffraction spectrum and to check the interface between the polyimide and metallic film, thereby verifying presence of nickel oxide at the interface, thereby verifying presence of various metallic oxide at the interface.

The thinly copper plated sample was kept as it was. The samples plated with metals other than copper were dipped in palladium chloride (1 g/l) for about 30 seconds. Then they were put in an electroless plating bath for thick copper plating. Composition of electroless copper plating solution for thick copper plating was the same as that given in Tenth Embodiment. Solution was kept at a temperature of 70° C. In about 20 seconds after start of the plating, separation of plated film was observed on the thinly copper plated sample. By contrast, no separation was observed on the samples plated with metals other than copper after a lapse of 3 hours. For the thinly copper plated sample, separation is estimated to have been caused by reduction of the copper oxide film formed at the interface with polyimide during electroless plating of a thick layer of copper. If electroless plating of a thick layer of copper carried out after the surface of the surface treated resin substrate was covered with the metal having a reduction potential more base than that of copper, reaction of oxide reduction does not take place, and interface between the polyimide and metal is not damaged; therefore, separation does not occur. This indicates that it is essential to cover the resin substrate with the metal having a base reduction potential prior to electroless plating of a thick layer of copper.

(Embodiment 13)

Upilex 25S by Ube Industries, Ltd. was used as a resin substrate comprising polyimide film. A 10 cm×10 cm sample was created and was subjected to oxygen plasma treatment by a dry etching apparatus (DEA-506 by Anerva) at a pressure of 800 Pa and at a flow rate of 25 SCCM.

Plasma output was changed in the range from 200 to 800 W and treatment time was also changed in the range from 5 to 45 minutes. Nitrogen was used as reaction gas, and plasma treatment was provided under the same treatment conditions. The treated surfaces was observed by a surface form analyzer (ESA-3000 by Elionix) to find the average centerline roughness (Ra). Furthermore, the treated sample was bonded on a glass epoxy resin substrate, and was then subjected to plating catalyst treatment in the same manner as specified in the Tenth Embodiment. Then electroless nickel plating solution (B-1 by Okuno Seiyaku) was used to deposit nickel to a film thickness of about 1 μm. The sample was baked at 180° C. in the atmosphere in the electric furnace for two hours. X-ray was irradiated from the resin substrate side of the samples at a low angle to measure diffraction spectrum and to check the interface between the resin substrate and nickel, thereby verifying presence of nickel oxide at the interface.

The sample was dipped in palladium chloride (1 g/l) for about 30 seconds.

Then it was put in an electroless plating bath for thick copper plating described in the Tenth Embodiment, where it was plated with copper to a thickness of about 20 μm. Solution was kept at a temperature of 70° C. The copper film side was fixed to the silicon wafer by a double-coated tape, and a peel test was conducted wherein the side of the polyimide film was pulled upward by 90 deg. at 25° C. to separate the film. The results of this test together with measurements of the average roughness (Ra) at the centerline are given in Table 3. It can be seen that a high peeling strength is ensured in both oxygen plasma treatment and nitrogen plasma treatment when Ra was equal to or greater than 0.1 μm. By contrast, peeling strength was reduced when plasma treatment time was long and Ra was equal to or greater than 1.0 μm. Observation of the separated interface suggests that the polyimide surface was embrittled by plasma treatment because resin components were attached on the separated nickel film side, with the result that the peeling strength was reduced. Thus, it is appropriate to provide plasma treatment to ensure that Ra is equal to or greater than 0.1 μm and is equal to or smaller than 1.0 μm. This shows that copper wiring boards having a high adhesion of 0.5 kN/m or more can be produced by electroless copper plating.

TABLE 3

| Reaction gas | Output (W) | Processing time (min.) | Ra (μm) | Peeling strength (N/m) |
|---|---|---|---|---|
| Oxygen | 400 | 15 | 0.05 | 400 |
|  | 800 | 5 | 0.07 | 500 |
|  | 800 | 15 | 0.13 | 700 |
|  | 800 | 25 | 0.19 | 900 |
|  | 800 | 50 | 0.75 | 800 |
|  | 800 | 75 | 1.32 | 300 |
| Nitrogen | 400 | 15 | 0.06 | 400 |
|  | 800 | 5 | 0.11 | 600 |
|  | 800 | 15 | 0.15 | 1100 |
|  | 800 | 25 | 0.21 | 1300 |
|  | 800 | 50 | 0.53 | 1100 |
|  | 800 | 75 | 1.05 | 400 |

(Embodiment 14)

Upilex 50S by Ube Industries, Ltd. was used as a resin substrate comprising polyimide film. Two 10 cm×10 cm samples were created and were subjected to oxygen plasma treatment by a dry etching apparatus (DEA-506 by Anerva) at a pressure of 3 Pa and at a flow rate of 25 SCCM. Plasma output was 800 W and treatment was continued for 25 minutes. The treated surfaces were observed to find the average centerline roughness (Ra) as in Thirteen Embodiment. The measurement was 0.2 μm. After measurement, the samples were bonded on glass epoxy resin substrates, and were then subjected to plating catalyst treatment in the same manner as specified in the Tenth Embodiment. Each sample was provided with electroless cobalt plating (plated to a film thickness of about 0.8 μm with DISCLAD 601 by Okuno Seiyaku), and electroless tin plating (plated to a film thickness of about 0.7 μm with SUBSTAR SN-2 by Okuno Seiyaku). After plating, samples were baked at 180° C. in the atmosphere in the electric furnace for two hours. They were dipped in palladium chloride (1 g/l) for about 30 seconds. Then they were put in an electroless plating bath for thick copper plating in the same manner as described in Tenth Embodiment. Solution was kept at a temperature of 70° C. Separation was not observed in ten hours of plating. Samples were plated to a film thickness of about 20 μm. After plating, a peel test was conducted wherein the polyimide film was pulled upward by 90 deg. at 25° C. to separate the film to evaluate the adhesion. Peeling strength was about 900 and 800 N/m for cobalt and tin plated samples, respectively. A thick copper film with a sufficient adhesion was formed on the polyimide film by electroless copper plating. Furthermore, these substrate samples were left to stand in nitrogen atmosphere at 300° C. for two hour. The peeling strength found out in the peel test exhibited was very high, similarly to that before heat treatment. A wiring board having a high reliability for heat resistance could be produced without adhesion reduced by heat treatment.

(Embodiment 15)

Upilex 50S by Ube Industries, Ltd. was used as a resin substrate comprising polyimide film. A 10 cm×10 cm sample was created and was bonded on a stainless plate be fixed in position. Then it was subjected to oxygen plasma treatment under the same conditions as the Tenth Embodiment. After treatment, it was subjected to plating catalyst treatment in the same manner as specified in the Tenth Embodiment. A photosensitive negative dry film was laminated on the surface of the sample, and plated resist was formed by exposure and development. The minimum resist line/space interval was 20 μm. The sample was separated from the stainless plate, and electroless nickel plating solution (B-1 by Okuno Seiyaku) was used to deposit nickel to a film thickness of about 1 μm. The sample was baked at 180° C. in the atmosphere in the electric furnace for two hours. The sample was then dipped in palladium chloride (1 g/l) for about 30 seconds. Then it was put in an electroless plating bath for thick copper plating described in the Tenth Embodiment, where it was plated with copper. Solution was kept at a temperature of 70° C. Separation was not observed either on resist and copper plated film in ten hours of plating. Samples were plated to a film thickness of about 20 μm. Excellent adhesion was observed without separation between the copper wiring portion and polyimide substrate. An optical microscope and scanning electron microscope were used to observe the copper wiring portion to find out that a copper wiring pattern with good reproduction of the resist profile was obtained. It has been verified that a copper wiring pattern having a line/space interval of 20 μm can be produced. When the cross section of the copper wiring portion was observed. Not a slightest level difference was found at the interface between the nickel and copper. The profile of the copper wiring portion was a faithful reproduction of that of the resist. Furthermore, a peel test was conducted to pull the wiring with a line width of 5 mm upward by 90 deg., and the peeling strength was as high as about 900 N/m. Then the substrate sample was left to stand in nitrogen atmosphere at 300° C. for two hour. The peeling strength found out in the peel test was as high as about 900 N/m, similarly to that before heat treatment. A wiring board having a high reliability for heat resistance could be produced without adhesion reduced by heat treatment.

(Embodiment 16)

Polybenzoxazole film was obtained in the same manner as specified in the Fourth Embodiment. The film was 40 μm thick. This was cut into 10 mm×10 mm pieces to be used as samples. Etching velocity was measured in the same manner as described in Tenth Embodiment, and the measurement was about 0.6 μm/min. Then a 10 cm×10 cm sample was created and was subjected to oxygen plasma treatment under the same conditions as described in Tenth Embodiment. After treatment, the sample was bonded on glass epoxy resin substrate, and was then subjected to plating catalyst treatment in the same manner as specified in the Tenth Embodiment. The sample was provided with electroless nickel plating solution (B-1 by Okuno Seiyaku) to deposit nickel to a film thickness of about 1 μm. The sample was baked at 180° C. in the atmosphere in the electric furnace for two hours, and was then dipped in palladium chloride (1 g/l) for about 30 seconds. Then it was put in an electroless plating bath for thick copper plating described in the Tenth Embodiment, where it was plated with copper. Solution was kept at a temperature of 70° C. Separation was not observed in ten hours of plating. The sample was plated to a film thickness of about 20 μm. After plating, a peel test was conducted to pull the copper film upward by 90 deg. at 25° C. to separate the film, thereby evaluating the adhesion of the copper film. The peeling strength found out in the peel test was about 700 N/m, exhibiting a sufficient adhesion. This sample was left to stand in nitrogen atmosphere at 300° C. for two hour. The peeling strength found out in the peel test was as high as about 650 N/m, similarly to that before heat treatment.

(Embodiment 17)

Upilex 50S by Ube Industries, Ltd. was used as a resin substrate comprising polyimide film. A 10 cm×10 cm sample was created and was treated in aqueous solution for surface modification at a liquid temperature of 70° C. for 2 minutes as described in First Embodiment. After treatment, it was bonded on the epoxy resin substrate with glass cloth, and was subjected to plating catalyst treatment in the same manner as specified in the First Embodiment. The sample was provided with electroless nickel plating solution (B-1 by Okuno Seiyaku) to deposit nickel to a film thickness of about 1 μm.

The sample was baked at 120° C. in the atmosphere in the electric furnace for two hours, and was then dipped in palladium chloride (1 g/l) for about 30 seconds. Then it was put in an electroless plating bath for thick copper plating described in the Tenth Embodiment, where it was plated with copper. Solution was kept at a temperature of 70° C. Separation was not observed in ten hours of plating. The sample was plated to a film thickness of about 20 μm. After plating, the copper film was fixed to the wafer, and a peel test was conducted to pull the copper film upward by 90 deg. to separate the film, thereby evaluating the adhesion of the copper film. The peeling strength found out in the peel test was about 900 N/m, and a thick copper film having a sufficient adhesion could be formed on the polyimide film by electroless copper plating. Thus, it is possible to provide a wring board production method which permits all processes to be performed in "wet" mode, thereby making a significant contribution to cost cutdown.

(Embodiment 18)

Figure 6:
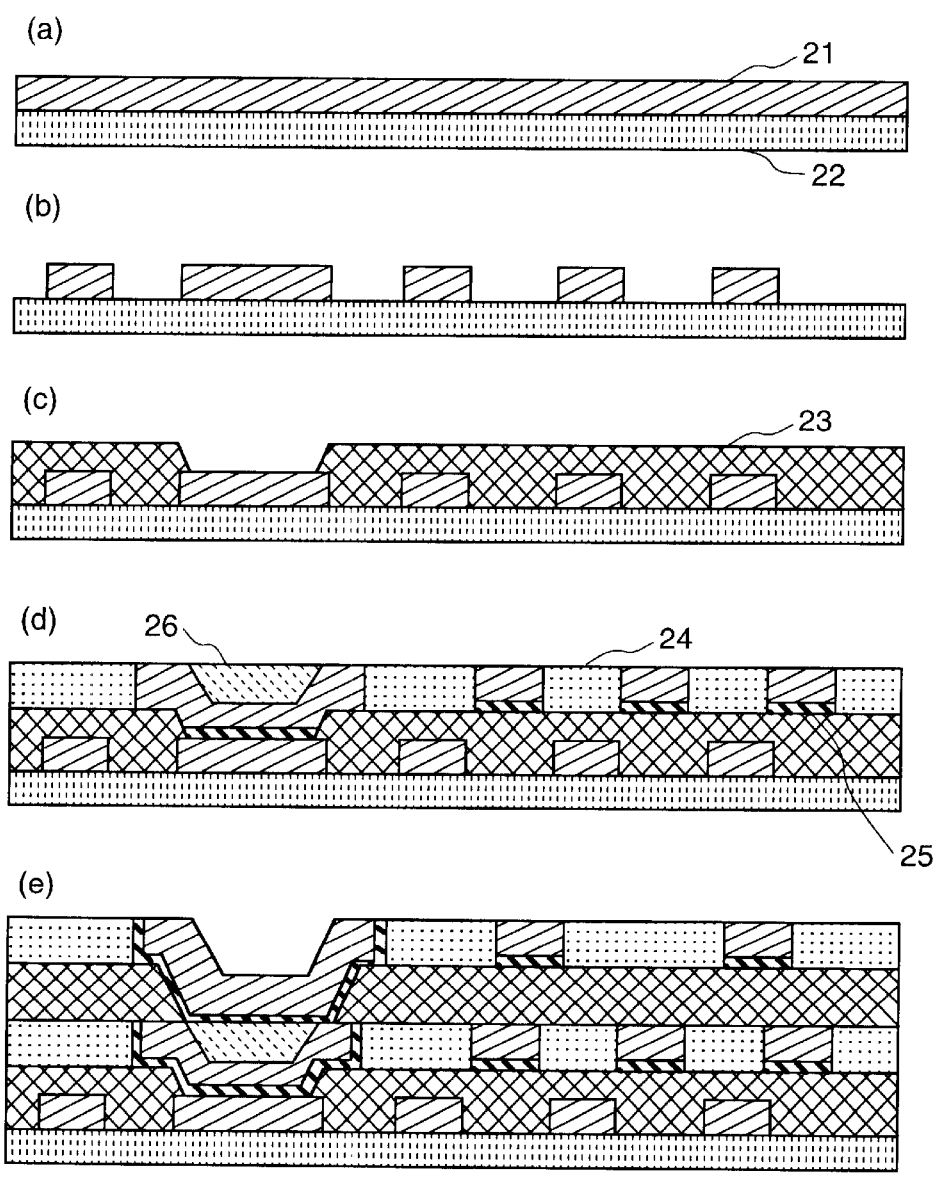
FIG. 6 is a process chart giving a schematic representation of manufacturing process of wiring boards using copper-plated laminates.

The following describes how to produce the wiring board comprising a fine wiring layer formed according to the full additive method laminated on a conductive circuit layer formed according to the subtract method using a copper-plated laminate. FIG. 6 shows the production process.

(a) Resin plate 22 comprising polyimide was plated with copper 21 and the laminate was laminated with a photosensitive dry film (Liston 1051 by Dupont). An image was printed by exposure to ultraviolet ray through the mask where a desired conductive circuit pattern was plotted.

(b) Then development was made by 1-1-1 trichloroethane, and copper was removed from the non-conductive portion with etching solution of cupric chloride. Then dry film was removed by methylene chloride.

(c) 20 mM of toluene solution of (3-aminopropyl) triethoxysilane (by Aldorich) was dipped and coated on this first layer conductive circuit. Then it was dried at 110° C. for 30 minutes. Polyimide varnish (PIQ-L100 by Hitachi Kasei) was applied thereon, and was cured at a setting temperature of 400° C., thereby getting a polyimide layer with the film thickness of about 15 μm. An inter-layer connection hole (50 μm in diameter) was opened at a specified position of this polyimide layer by an excimer laser (KrF), and the remainder was removed by desmearing.

(d) Then the polyimide surface of the surface layer was subjected to oxygen plasma treatment, then to plating catalyst treatment under the same conditions as the Tenth Embodiment. Then the surface of polyimide was laminated with resist 24 comprising a photosensitive negative dry film, and exposure and development were carried out through the mask to form plated resist. When the plated resist is formed, a mask was produced to ensure that the connection hole provided in the previous process and the land thereof would be exposed, and was put to use. The minimum resist line/space interval was 20 μm. Then electroless nickel plating solution (B-1 by Okuno Seiyaku) was used to deposit nickel 25 to a film thickness of about 1 μm. The substrate was baked at 180° C. in the atmosphere in the electric furnace for two hours. The sample was then dipped in palladium chloride (1 g/l) for about 10 seconds. Then it was put in an electroless plating bath for thick copper plating described in the Tenth Embodiment, where it was plated with copper, thereby forming a second layer conductive circuit pattern on the polyimide layer and a connection conductor inside the connection hole linking between the first layer conductive circuit pattern and second layer conductive circuit pattern. Plating solution was kept at a temperature of 70° C., and plating was carried out for eight hours to get a copper film having a thickness of about 16 μm.

Figure 7:
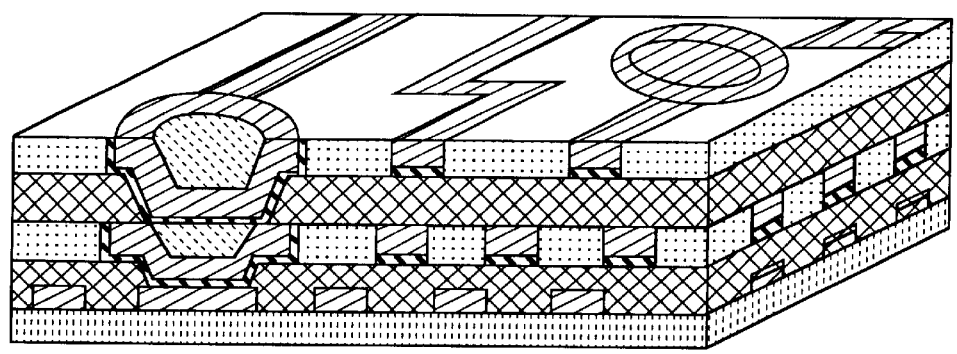
FIG. 7 is a perspective view of wiring boards manufactured using copper-plated laminates.

(e) Then the connection hole was filled with copper paste. Polyimide varnish was again applied to form a polyimide layer, and an hole was opened by laser. After a photosensitive dry film was laminated, plated resist was provided by exposure and development. A wiring layer was formed by electroless plating in the same way as above, thereby performing metallization inside the connection hole. In the final phase, the connection hole was filled with copper paste 26. FIG. 7 shows the perspective view of the wiring board produced. An optical microscope and scanning electron microscope were used to observe the copper wiring portion on the top layer to find out that a copper wiring pattern with good reproduction of the resist profile was obtained. It has been verified that a copper wiring pattern having a line width of 30 µm and a line/space interval of 20 µm can be produced. When this substrate was left to stand in the atmosphere at 150° C. for 1000 hours, wire disconnection or separation was not observed. This indicates that this wiring board ensures a highly reliable operation under high temperature conditions for a long time.

(Embodiment 19)

Figure 8:
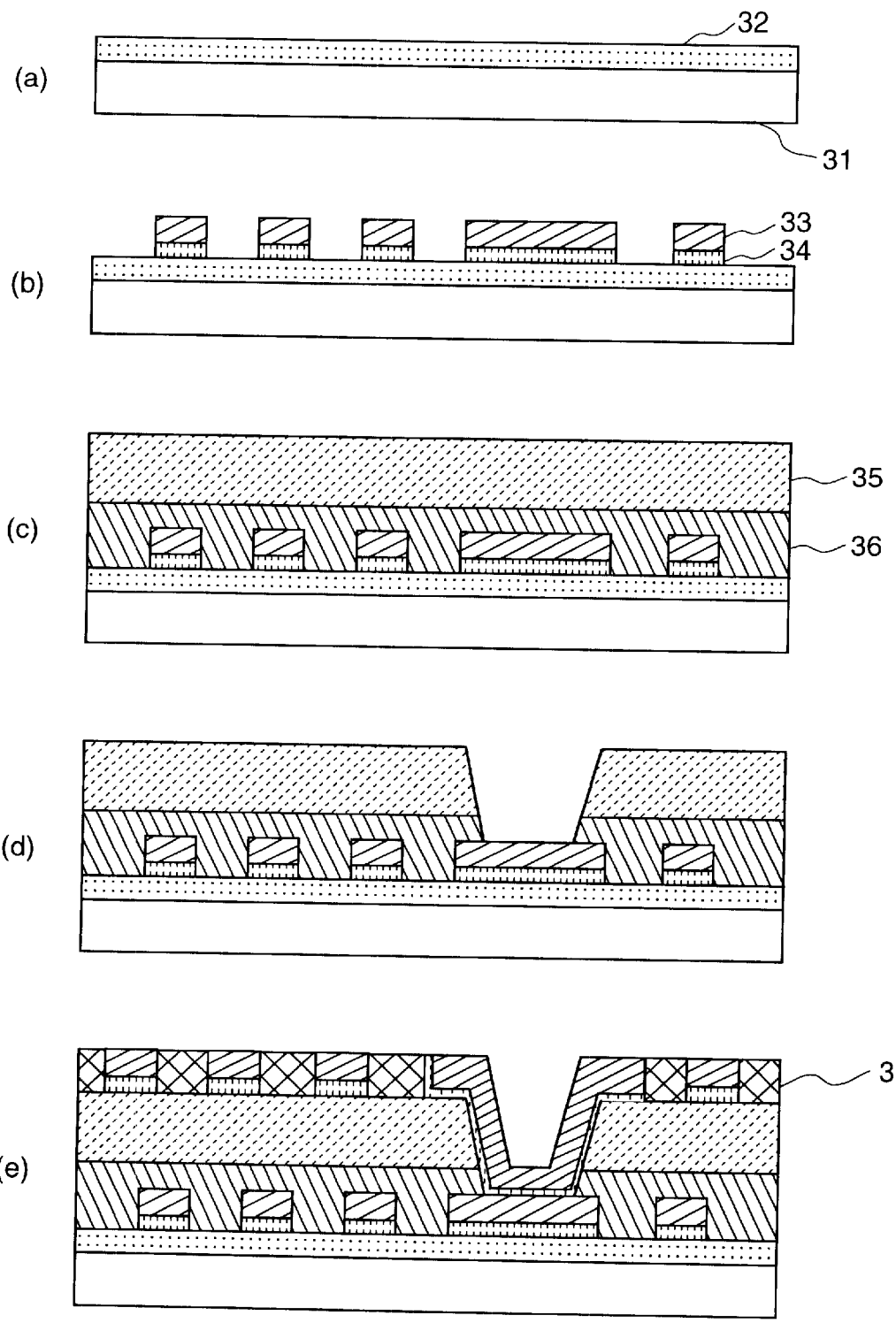
FIG. 8 is a process chart giving a schematic representation of manufacturing process of wiring boards laminated on the silicon wafer in two layers according to the full additive method.

The following describes how to produce the wiring board comprising two fine wiring layers formed by the full additive method laminated on the silicon wafer substrate. FIG. 8 is a schematic diagram showing the production process.

(a) After 20 mM of toluene solution of (3-aminopropyl) triethoxysilane (by Aldorich) was dipped and coated on the silicon wafer, it was dried at 110° C. for 30 minutes. Polyimide varnish (PIQ-L100 by Hitachi Kasei) was applied thereon, and was cured at a setting temperature of 400° C., thereby getting a polyimide film 32.

(b) The film thickness was 5 µm. Then this polyimide film surface was subjected to oxygen plasma treatment, then to plating catalyst treatment under the same conditions as the Forth Embodiment. Then the surface of the sample was laminated with a photosensitive negative dry film, and exposure and development were carried out to form plated resist. The minimum resist line/space interval was 20 µm. Then electroless nickel plating solution (B-1 by Okuno Seiyaku) was used to deposit nickel 34 to a film thickness of about 0.4 µm. The sample was baked at 180° C. in the atmosphere in the electric furnace for two hours. The sample was then dipped in palladium chloride (0.2 g/l) for about 10 seconds. Then it was put in an electroless plating bath for thick copper plating described in the Tenth Embodiment, where it was plated with copper. Plating solution was kept at a temperature of 70° C. Separation of resist or plated copper film was not observed in 2.5 hours of plating. The sample was plated to a with copper film 33 to a thickness of about 5 µm. Then the plated resist was separated.

(c) There was no separation between copper wiring and polyimide film, and excellent adhesion was observed. Furthermore, polyimide film (Upilex 12.5S by Ube Industries) was pressure bonded on this first wiring layer through the adhesive film 36 (N4 by Hitachi Kasei Kogyo, at an adhesion temperature of 250° C. and film thickness of 10 µm) to form the second insulating layer.

(d) An inter-layer connection hole (50 µm in diameter) was opened at a specified position of this second polyimide layer by an excimer laser (KrF), and the remainder was removed by desmearing.

(e) The second layer conductive circuit pattern on the second insulating layer and a connection conductor inside the connection hole linking between the first layer conductive circuit and second layer conductive circuit were formed by repeating the same process of forming the first wiring layer using the plated resist 37. After the produced substrate was cut by the dicer, the cross section was polished and was observed by the optical and scanning electron microscope to find out that a copper wiring pattern with good reproduction of the resist profile was obtained. It has been verified that a copper wiring pattern having line/space interval of 20 µm was formed for both the first and second conductive circuit layers, and electric connection is ensured by effective deposition of copper plating in the inter-layer connection hole. When this substrate was left to stand in the atmosphere at 150° C. for 1000 hours, wire disconnection or separation was not observed. This indicates that this wiring board ensures a highly reliable operation under high temperature conditions for a long time.

(Embodiment 20)

Figure 9:
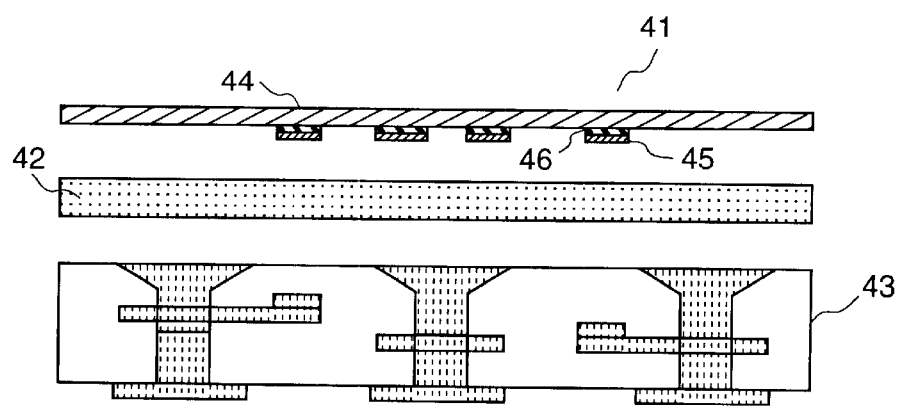
FIG. 9 is a process chart showing lamination of wiring sheets comprising resin film wiring layers formed on the ceramic substrate.
Figure 9:
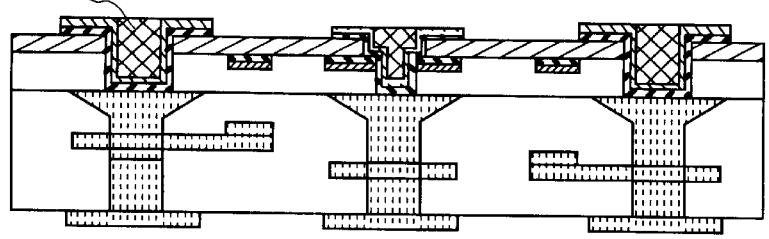

The following describes how to produce the multi-chip module substrate formed by laminating the wiring board with copper wiring provided on the insulating resin substrate according to the full additive method, on the ceramic substrate produced by the normal thick film formation process. FIG. 9 illustrates an embodiment of the process of producing this module. The authors of the present invention produced a single-sided wiring sheet 41 wherein copper wiring is formed only on one side of the polyimide film (Upilex 12.5S by Ube Industries) in the same manner as Eighteenth Embodiment and the wiring layer was formed on the other side. This wiring sheet was bonded on the ceramic substrate through the adhesive film 42 (N4 by Hitachi Kasei Kogyo, at an adhesion temperature of 250° C. and film thickness of 10 µm) using a parallel flat plate in the direction where the copper wiring side contacted the adhesive film. To ensure electric connection between a pad on ceramic substrate 43 and wiring layer, an inter-layer connection hole (50 µm in diameter) was opened at a specified position by an excimer laser (KrF), and the remainder was removed by desmearing. After metallization inside the connection hole by selective copper plating method to a film thickness of 5 µm, the hole was filled with copper paste 44.

Figure 10:
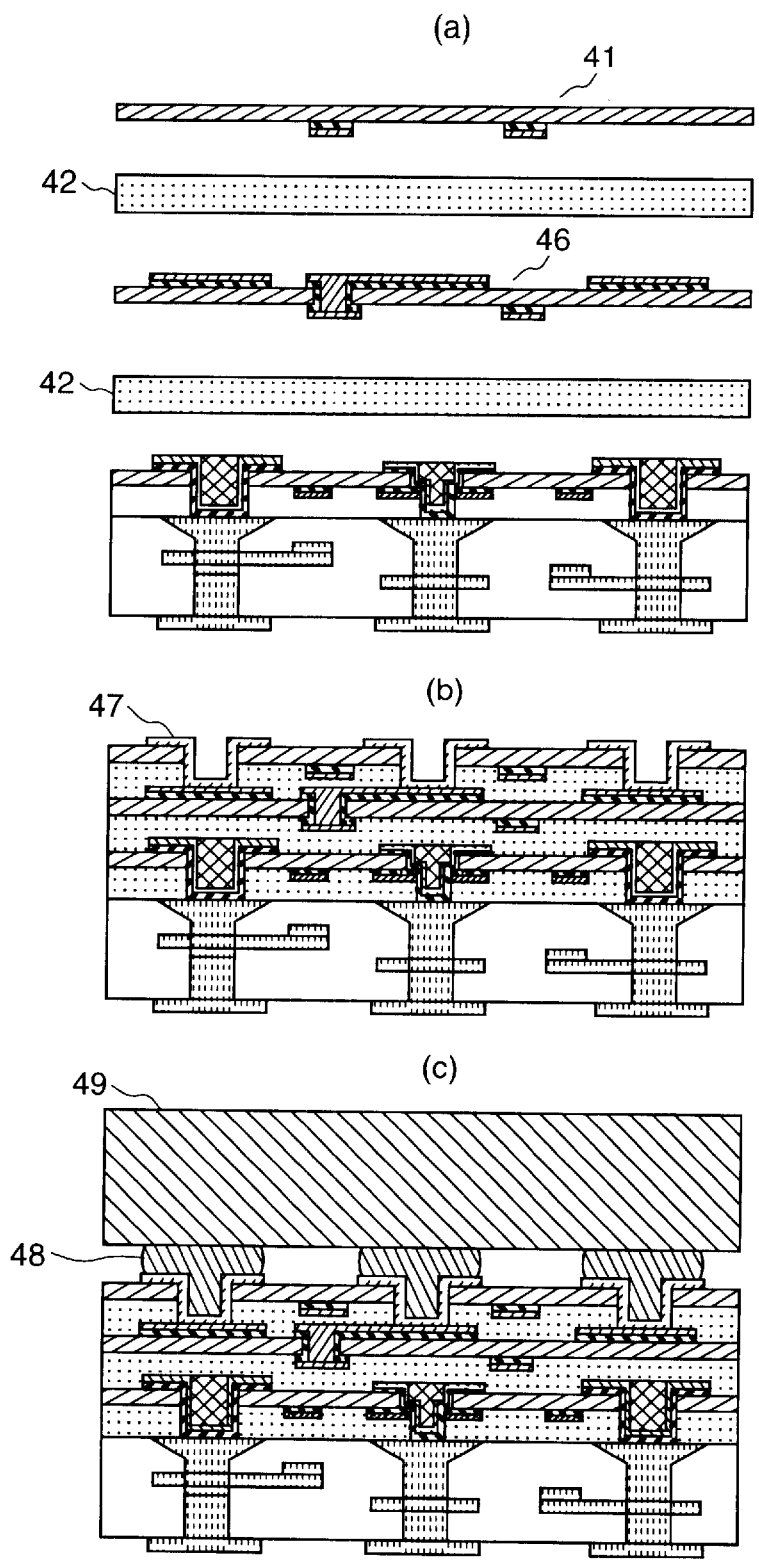
FIG. 10 is a process chart for the production of multi-chip module substrates and a cross sectional view of a multi-chip module loaded with LSI.

FIG. 10 is a partial cross sectional view of a multi-chip module wherein a 6-layered wiring resin substrate is mounted on the ceramic substrate obtained from FIG. 9, and an LSI chip is mounted by the flip chip bonding method.

The wiring sheet where copper wiring is formed on both sides of the polyimide film in the same manner as Eighteenth Embodiment was bonded on this wiring sheet through the same adhesive film 42 as aforesaid, using a parallel flat plate. Then a single-sided wiring sheet 41 where copper wiring is formed only on one side of the polyimide film (Upilex 12.5S by Ube Industries) in the same manner as Eighteenth Embodiment was bonded through the same adhesive film 42 as aforesaid, using a parallel flat plate in the direction where the copper wiring side contacted the adhesive film. A hole was opened at a specified position on the laminated sheet surface by an excimer laser (KrF248 nm), and surface layer (Cr/Ni/Au) was formed. Then a multi-chip module was produced by mounting several LSI chips according to the flip chip bonding method. Wire disconnection or separation was not observed on this wiring board even after connection by soldering. This indicates that this wiring board is highly reliable under high temperature conditions.

What is claimed is:

1. A wiring board including a wiring layer comprising a plated film having a line width of 10 to 40 µm and a thickness of 15 to 45 µm, formed on an insulating resin substrate through a degenerated layer formed on the surface of said insulating resin substrate, and an average roughness at the centerline of at least said substrate in a portion where said wiring layer is formed, is 1.0 µm or less.

2. A wiring board including a wiring layer provided on an insulated resin board, through a degenerated layer including an amide group formed on a surface of said resin board and through layers including a metallic oxide layer formed on a surface of said wiring layer.

3. A wiring board including a wiring layer provided on an insulated resin board, through a degenerated layer, where an average roughness at the centerline of the surface of said resin board is 0.1 to 1.0 μm, and also through layers including a metallic oxide layer formed on a surface of said wiring layer.

4. A wiring board according to any one of claims 2 and 3 wherein said wiring layer includes a catalyst layer, an electroless metal plated film and an electroplated film sequentially laminated and formed on the surface of said metallic oxide layer.

5. A wiring board according to claim 2 wherein said metallic oxide layer comprises an oxide of a metal having a reduction potential more base than that of copper.

6. A wiring board according to claim 5 wherein said insulated resin board contains polyimide resin, and the metal having a reduction potential more base than that of copper contains at least one of nickel, tin and cobalt.

7. A wiring board according to any one of claims 2, 3, 5 and 6 wherein said insulated resin board and said wiring layer are alternately laminated, and a bonding pad for semiconductor element connection is provided on a surface of an insulated resin board of the alternately laminated insulated resin board and wiring layer.

8. Wiring board structure comprising the wiring board according to any one of claims 2, 3, 5 and 6 laminated on ceramic wiring board structure, and a bonding pad for semiconductor element connection is formed on a surface of said insulated resin board.

9. A semiconductor apparatus wherein a semiconductor element is connected to the bonding pad according to claim 8 by soldering.

10. A semiconductor apparatus wherein a semiconductor element is connected to the bonding pad according to claim 7 by soldering.

11. A wiring board according to claim 4 wherein said insulated resin board and wiring layer are alternately laminated, and a bonding pad for semiconductor element connection is provided on a surface of an insulated resin board of the alternately laminated insulated resin board and wiring layer.

12. Wiring board structure comprising the wiring board according to claim 4 laminated on ceramic wiring board structure, and a bonding pad for semiconductor element connection is formed on a surface of said insulated resin board.

13. A semiconductor apparatus wherein a semiconductor element is connected to the bonding pad according to claim 12 by soldering.

14. A semiconductor apparatus wherein a semiconductor element is connected to the bonding pad according to claim 11 by soldering.

15. A wiring board according to claim 1 wherein a metallic oxide layer is provided on a surface of the wiring layer, between the wiring layer and the degenerated layer.

16. A wiring board according to claim 15 wherein said wiring layer includes a catalyst layer, an electroless metal plated film and an electroplated film sequentially laminated and formed on the surface of said metallic oxide layer.

17. A wiring board according to claim 1 or 16, wherein said insulating resin substrate and wiring layer are alternately laminated, and a bonding pad for semiconductor element connection is formed on a surface of an insulating resin substrate of the alternately laminated insulating resin substrate and wiring layer.

18. A semiconductor apparatus wherein a semiconductor element is connected to the bonding pad according to claim 17 by soldering.

19. Wiring board structure comprising the wiring board according to claim 1 or 16 laminated on ceramic wiring board structure, and a bonding pad for semiconductor element connection is formed on a surface of said insulating resin substrate.

20. A semiconductor apparatus wherein a semiconductor element is connected to the bonding pad according to claim 19 by soldering.

* * * * *